US006879196B2

(12) United States Patent
    Lutkemeyer

(10) Patent No.: US 6,879,196 B2
(45) Date of Patent: *Apr. 12, 2005

(54) SYSTEM AND METHOD FOR COMPENSATING FOR SUPPLY VOLTAGE INDUCED CLOCK DELAY MISMATCHES

(75) Inventor: Christian A.J. Lutkemeyer, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/760,077

(22) Filed: Jan. 16, 2004

(65) Prior Publication Data

US 2004/0145397 A1 Jul. 29, 2004

Related U.S. Application Data

(63) Continuation of application No. 10/280,569, filed on Oct. 25, 2002, now Pat. No. 6,693,475, which is a continuation of application No. 09/772,104, filed on Jan. 24, 2001, now Pat. No. 6,501,311.
(60) Provisional application No. 60/177,776, filed on Jan. 24, 2000, and provisional application No. 60/182,421, filed on Feb. 14, 2000.

(51) Int. Cl.[7] ............................................. H03L 7/00
(52) U.S. Cl. ..................... 327/161; 327/153; 327/158

(58) Field of Search .............................. 327/147, 152, 327/153, 156, 158, 159, 161, 333, 143

(56) References Cited

U.S. PATENT DOCUMENTS

| | | | | | |
|---|---|---|---|---|---|
| 4,496,861 | A | * | 1/1985 | Bazes | 327/146 |
| 4,922,141 | A | * | 5/1990 | Lofgren et al. | 327/158 |
| 5,118,975 | A | * | 6/1992 | Hillis et al. | 327/158 |
| 5,900,752 | A | * | 5/1999 | Mar | 327/143 |
| 6,072,347 | A | * | 6/2000 | Sim | 327/276 |
| 6,184,733 | B1 | * | 2/2001 | Wang et al. | 327/157 |

* cited by examiner

*Primary Examiner*—Tuan T. Lam
(74) *Attorney, Agent, or Firm*—McAndrews, Held & Malloy, Ltd.

(57) ABSTRACT

Various systems and methods providing signal delay compensation for circuits such as a multi-pair gigabit Ethernet transceiver are disclosed. In an analog implementation a buffer with an adjustable delay may be used to minimize the delay mismatch between clock trees. The delay of the adjustable-delay buffer is controlled by bias voltages that determine the charging and discharging current to the adjustable buffer. A phase detector circuit is used to compare the clock phases for rising and falling edges, and to adjust the bias voltages that control these edges. In a digital implementation a selector switch, responsive to a phase detector, may be used to route clock signals through circuit elements to delay clock signals.

19 Claims, 25 Drawing Sheets

SYSTEM AND METHOD FOR COMPENSATING FOR SUPPLY VOLTAGE INDUCED CLOCK DELAY MISMATCHES

CROSS-REFERENCE TO RELATED APPLICATIONS

This application is a continuation of patent application Ser. No. 10/280,569, filed Oct. 25, 2002 now U.S. Pat. No. 6,693,475, which is a continuation of patent application Ser. No. 09/772,104, filed Jan. 24, 2001 (now U.S. Pat. No. 6,501,311), which claims the benefit of U.S. Provisional Application No. 60/177, 776, filed Jan. 24, 2000 and U.S. Provisional Application No. 60/182,421, filed Feb. 14, 2000.

FIELD OF THE INVENTION

The present invention relates generally to electronic circuits and, more particularly, to efficient clock domain partitioning and clock delay matching.

BACKGROUND OF THE INVENTION

There is a perpetual need for increased operating speed in electronics circuits used in electronic equipment. For example, circuit designers are continually developing communication circuits and microprocessors that can send and process data, respectively, at faster and faster rates.

However, tradeoffs typically must be made between the speed at which a circuit operates and the power the circuit consumes. In general, a circuit that operates at a higher speed than a comparable circuit will consume more power than that comparable circuit. In many circumstances, there is a practical limit on the amount of power a given circuit can or should consume. For example, increased power consumption typically results in a higher overall cost for the system. Moreover, certain types of electronic circuits such as integrated circuits can only dissipate a limited amount of power. High power consumption may also have other adverse effects on the operation of a circuit such as reducing the reliability of the circuit and adversely affecting the timing relationships in the circuit.

It has been observed that in some circuits not all of the circuitry has the same speed requirements. That is, some of the circuitry may operate at slower speeds than other circuitry. In this case, multiple supply voltages may be used to reduce the power dissipation of the integrated circuit. Those circuits that are speed sensitive are driven at a higher operating voltage while the less speed critical circuits are driven at a lower operating voltage. As a result, the less speed critical circuit will consume less power.

Typically, signals will be sent between these high-power and low-power circuits. In the case where these signals are referenced to a common system clock signal, the two circuits will be driven by clock signals derived from the common system clock signal. These derived clock signals, in turn, are generated by circuit components that operate at the respective operating voltage. That is, clock signals for the high-power circuits are generated by circuit components that operate at the high operating voltage. Clock signals for the low-power circuits are generated by circuit components that operate at the low operating voltage.

As in virtually all electronic circuits, the circuit components that generate the clock signals induce a delay in signals that pass through them. Moreover, the delay of a given circuit component depends, in general, on the supply voltage. In addition, supply voltages may deviate from their nominal values by certain tolerances, for example, +/−10%.

As a result of these delays, the clocks that drive the circuit components that operate at different supply voltages may be skewed in time relative to one another. Moreover, this skew in time may vary over time as the supply voltages deviate within their operating tolerances.

This misalignment of the clock signals in the different domains may result in clock uncertainty. This, in turn, may reduce the available cycle time of the circuit because the clock uncertainty has to be compensated by asynchronous delays when a signal is exchanged between the two domains within one clock cycle. As a result, it may be impossible to double latch the signals. In sum, this misalignment of the clock signals may corrupt data being processed by the circuit.

SUMMARY OF THE INVENTION

The invention is directed to systems and methods for providing clock signals to circuits driven by different operating voltages. According to the invention, the clock signals for the circuits driven by the different operating voltages are delayed, as necessary, to reduce the phase difference between the clock signals.

One embodiment of a system constructed according to the invention incorporates a buffer with an adjustable delay to reduce the delay mismatch between clock signals driven by clock trees associated with each operating voltage. A phase detector circuit compares the clock phases for rising and falling edges of the clock signals for each operating voltage. The phase detector circuit controls bias voltages that, in turn, control the delay of the adjustable-delay buffer.

Another embodiment of a system constructed according to the invention incorporates a selector circuit that selectively routes the clock signals for the different operating voltages through an appropriate number of circuit elements to adjust the delay of those clock signals. In this embodiment, the selector circuit is controlled by a phase detector that compares the edges of the clock signals for the different operating voltages.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION OF THE INVENTION

The invention is described below, with reference to detailed illustrative embodiments. It will be apparent that the invention can be embodied in a wide variety of forms, some of which may be quite different from those of the disclosed embodiments. Consequently, the specific structural and functional details disclosed herein are merely representative and do not limit the scope of the invention.

Figure 1:
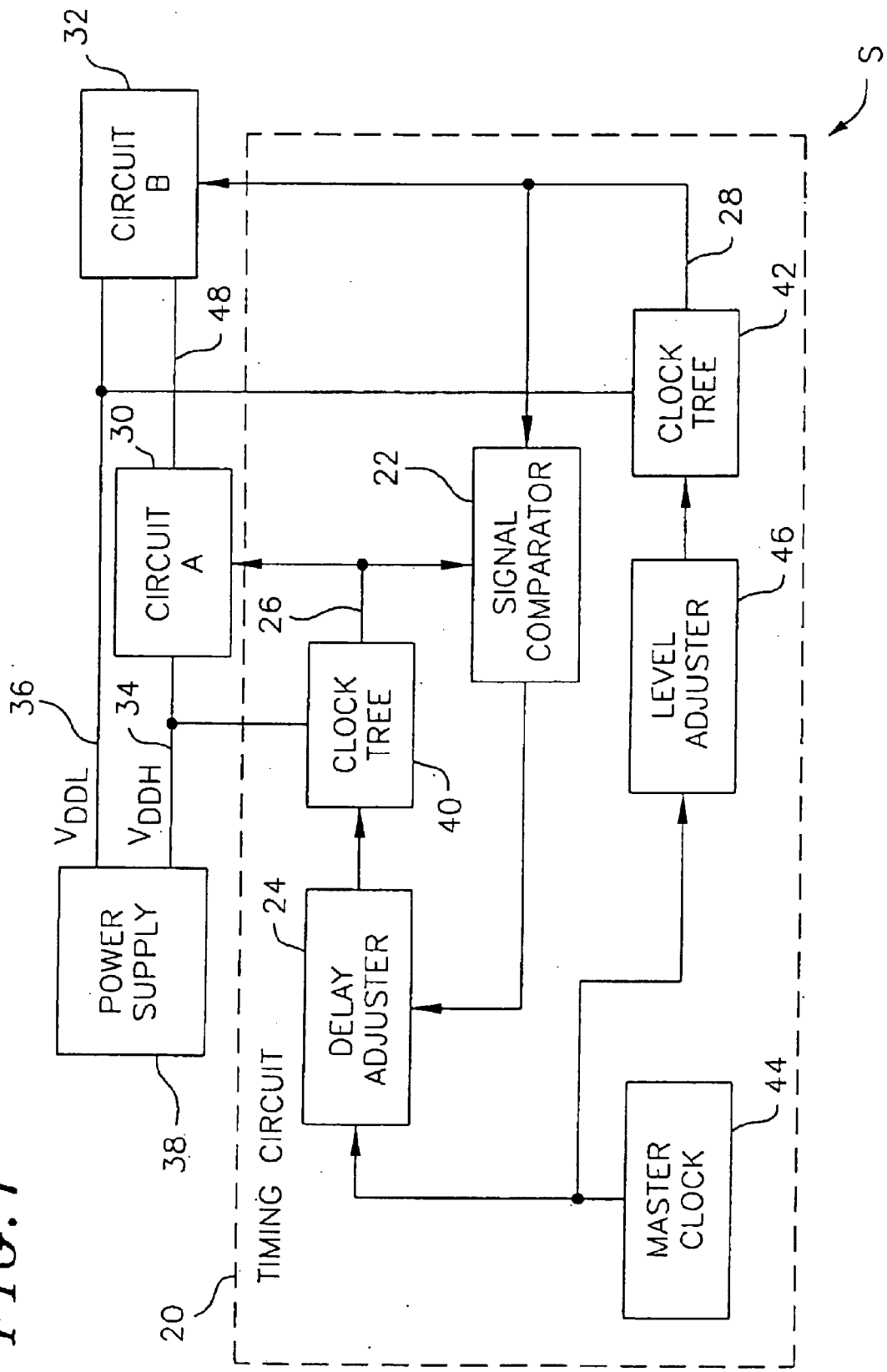
FIG. 1 is a block diagram of one embodiment of a system incorporating delay compensation according to the invention.

FIG. 1 is a block diagram of one embodiment of a system utilizing clock delay compensation in accordance with the present invention. Specifically, the system S incorporates a timing circuit 20 that includes a signal comparator 22 and a delay adjust circuit 24 for maintaining phase synchronization between clocks 26 and 28 that drive circuit A 30 and circuit B 32, respectively.

The system of FIG. 1 typically is implemented in an integrated circuit where multiple supply voltages are used to reduce the power dissipation of the integrated circuit. In this case, less timing-critical parts operate on a lower supply voltage than timing-critical parts of the circuit. For example, in FIG. 1 each of the circuits 30 and 32 is powered by a different supply voltage (VDDH 34 and VDDL 36). In practice, a single power supply or more than one power supply 38 may be used to generate supply voltages 34 and 36.

As mentioned above, the circuits 30 and 32 may be driven by different clock signals 26 and 28. Typically, clock trees are used to buffer a master clock signal to provide clock signals with sufficient current drive to the circuits. In FIG. 1, the master clock signal drives two clock trees, one buffer tree in the high voltage domain, and the other buffer tree in the low voltage domain.

A clock tree 40 generates the clock signals 26. As shown in FIG. 1, the clock tree 40 is powered by supply voltage VDDH 34 so that the clock signals 26 have the appropriate voltage level for circuit A 30. In this embodiment, the clock signal is generated by a master clock 44 that is powered by supply voltage VDDH 34.

A clock tree 42 generates the clock signals 28. The clock tree 42 is powered by supply voltage VDDL 36 so that the clock signals 28 have the appropriate voltage level for circuit B 32. To this end, a level shifter 46 is provided to shift the level of the clock signal generated by the master clock 44 to a level compatible with circuits powered by supply voltage VDDL 36.

Figure 2:
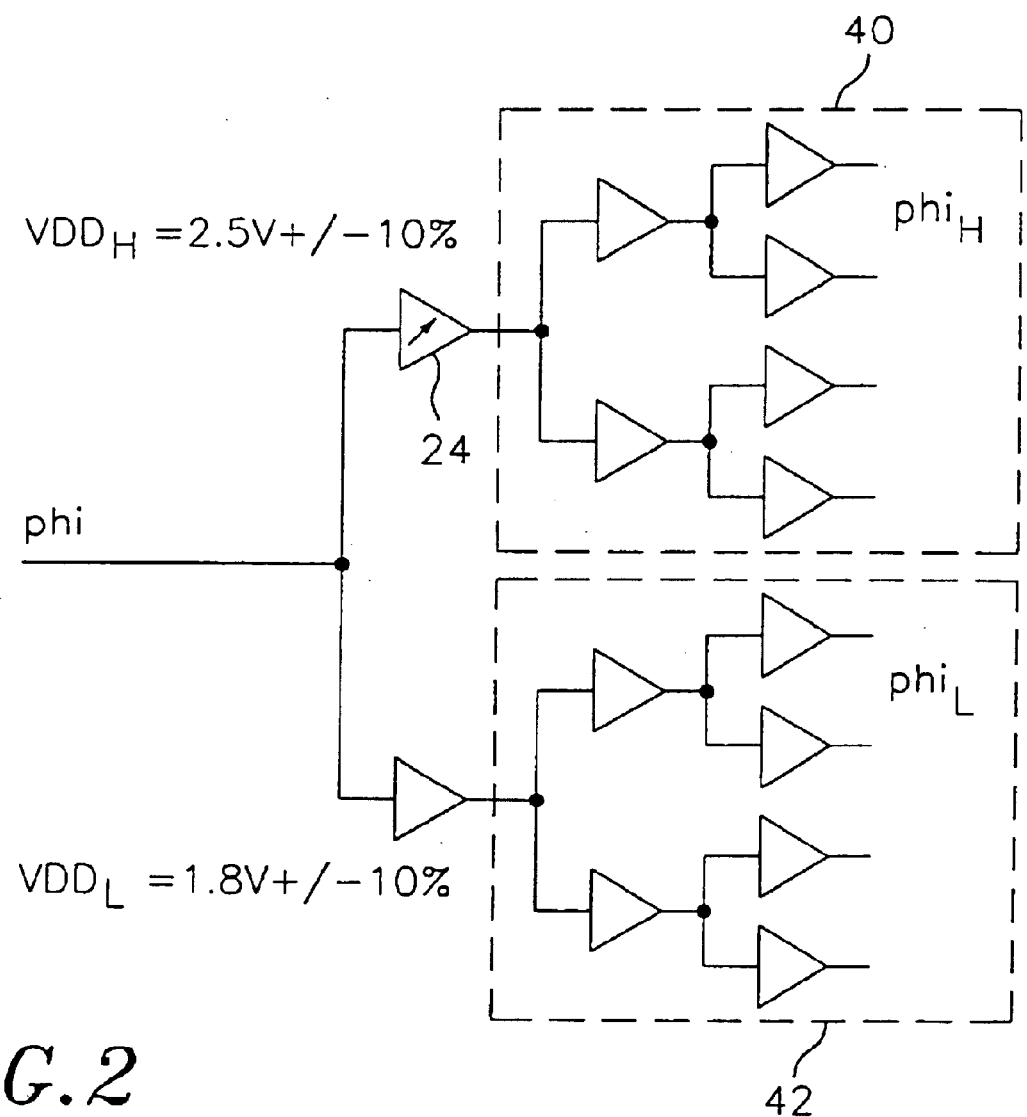
FIG. 2 is block diagram of one embodiment of a clock tree.

FIG. 2 illustrates one implementation of the clock trees 40 and 42. As represented in FIG. 2, both clock trees are driven by a common clock signal designated phi. Clock tree 40 generates a set of clock signals designated phiH. Clock tree 42 generates a set of clock signals designated phiL. Clock tree 40 has a supply voltage VDDH of 2.5 volts. Clock tree 42 has a supply voltage VDDL of 1.8 volts. Either of these supply voltages may vary by +/−10% due to temperature and other variants.

Figure 3:
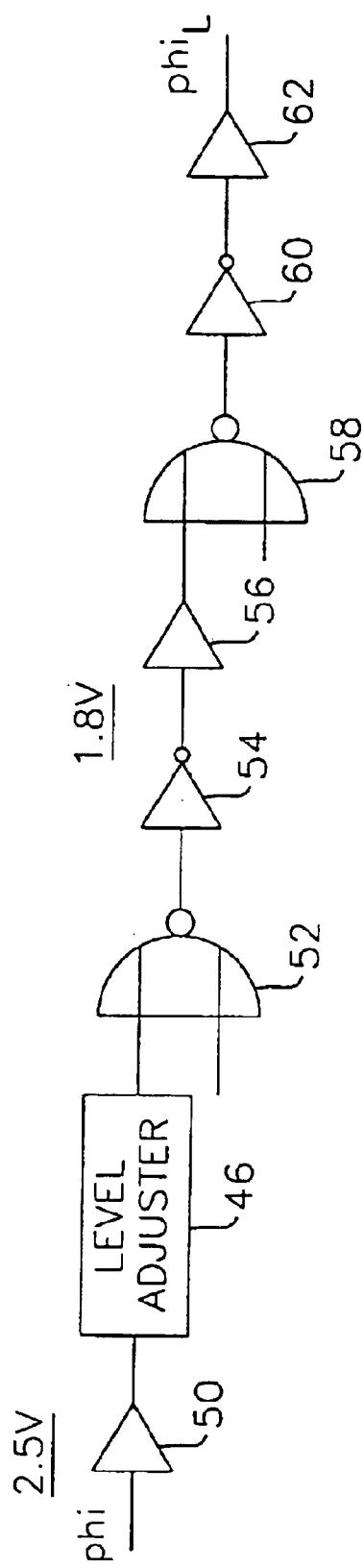
FIG. 3 is a schematic diagram of one embodiment of a branch of the clock tree of FIG. 2.

FIG. 3 illustrates how the clock signal phi may be delayed as it passes through each of the components in a clock tree. The schematic at the top of FIG. 3 represents one embodiment of a branch of the clock tree 42 along with the level shifter 46. Each branch of the clock tree includes several buffers, the number of which will depend, in part, on the number of branches required for the clock tree and the current drive capability of the buffers. The level shifter 46 converts the signal level of the clock signal from the 2.5 volt range to the 1.8 volt range.

The chart immediately below the schematic in FIG. 3 illustrates delay characteristics of the clock tree 42 and the level shifter 46. The symbols SS, TT and FF represent simulations at the slow slow, typical typical and fast fast corners, respectively (e.g., worse case, typical case and best case scenarios). Each row in the chart sets forth the delays (in nanoseconds, nS) for a given part of the branch. For example, for the typical case, the dispersed buffer cell 50 has a delay of 0.26 nS. The level shifter 46, nand gate 52, inverter 54 and buffer 56 have a total delay of 1.02 nS. The nand gate 58, inverter 60 and buffer 62 have a total delay of 0.72 nS. Thus, the total delay for the branch is 2.00 nS.

Figure 4:
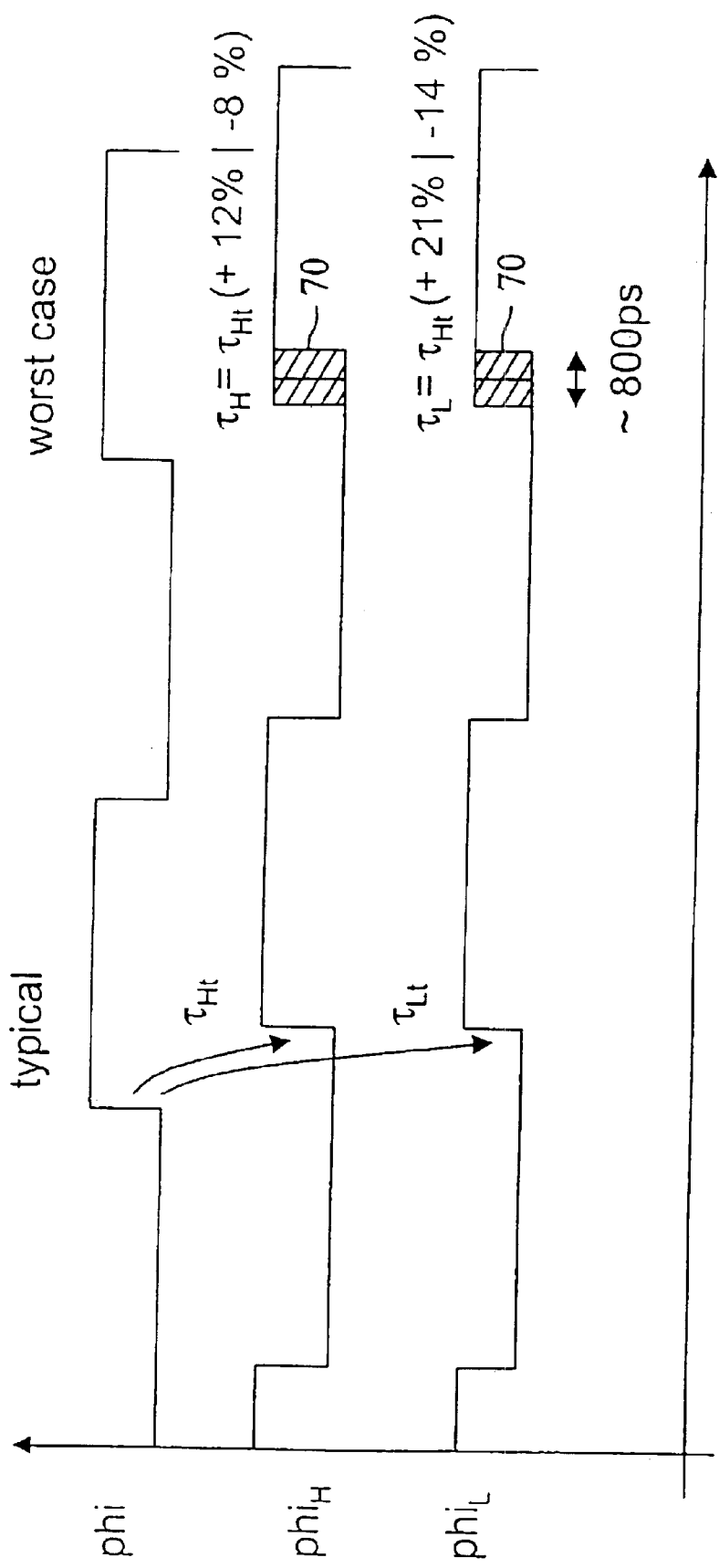
FIG. 4 is an exemplary timing diagram for the three clock signals of FIG. 2.

The delay of these buffers is supply voltage dependent. In other words, when the supply voltage in a given domain changes, the delays of the buffers may change. This scenario is illustrated in FIG. 4 which depicts exemplary timing diagrams for the three clock signals, phi, phiH and phiL. Under typical conditions, the circuit may be designed so that phiH and phiL are delayed by approximately the same amount of time, $\tau_{Ht}$ and $\tau_{Lt}$, respectively. However, when one of the supply voltages changes (e.g., VDDH decreases by 10%), the delay though the corresponding buffer tree (e.g., buffer tree 40) may increase (e.g., by 12%). This situation is indicated graphically in FIG. 4 as edges of the clock signal moving in time either to the left or right.

Significantly, the supply voltages may change independently of each other. Thus, even if the clock trees are nominally designed to have the same delay, under normal operating conditions the actual delay of the clock trees may be mismatched by several hundred picoseconds. This may occur, for example, when one supply voltage is at its maximum value and the other is at its minimum value. Under these worse case conditions the edges of the clock signal might move in time either to the left or right by the maximum amounts indicated in FIG. 4 (e.g, $\tau_{Ht}$+12%/−8%; $\tau_{Lt}$+21%/−14%). In the example of FIG. 4, this may cause ±800 picoseconds of phase shift between phiH and phiL as indicated by the filled portions 70 of the timing diagrams.

Referring again to FIG. 1, these variations in the two supply voltages may cause an out of phase relationship between the clock signals 26 and 28 for circuit A 30 and circuit B 32. As represented by line 48 in FIG. 1, circuits 30 and 32 typically send signals to one another (e.g., when a register in circuit A 30 sends a signal to a register in circuit B 32). Depending upon the particular application, these signals may be referenced to the master clock 44. Given that the amount of the delay through the clock trees 40 and 42 may be dependent on supply voltage, it is possible that there will be a phase difference (mismatch) between these clock signals.

This phase difference could have an adverse effect on data transfers between the two circuits. For example, the phase difference typically would reduce the cycle time for circuit operations. That is, the circuits will have to be designed to provide more delay in the system timing between operations than would otherwise be required. This in turn would decrease the speed at which the circuits could operate. Moreover, this mismatch may lead to race conditions between registers that are clocked by clock signals 26 and 28.

In accordance with the invention, this phase mismatch may be corrected by varying the delay of one of the clock signals (e.g., phiH) to compensate for the phase mismatch between the clock signals. This delay is regulated to keep the phase difference between the two clock signals as close to zero as possible. FIG. 1 describes one embodiment of such a circuit. In FIG. 1 a signal comparator 22 (e.g., a phase detector) compares the clock signals at the ends of the two clock trees 40 and 42 to determine the phase difference between the clock signals 26 and 28. Depending on the result of the comparison, the signal comparator 22 sends signals to the delay adjust circuit 24 to increase or decrease the delay of clock signal to clock tree 40.

Figure 5:
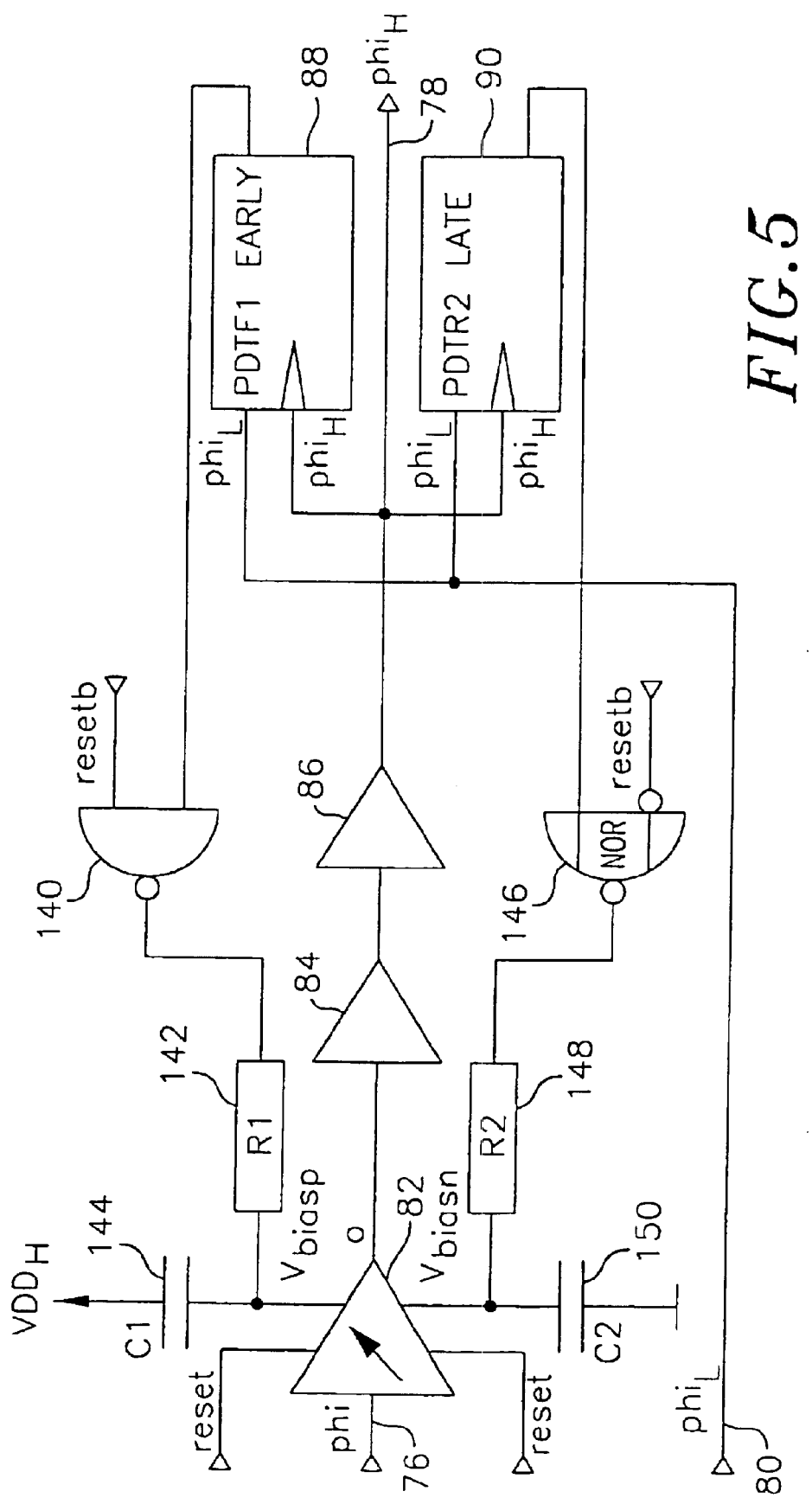
FIG. 5 is a block diagram of one embodiment of an analog delay locked loop circuit according to the invention.

Referring now to FIG. 5, a preferred embodiment of an analog delay locked loop ("DLL") for performing phase detection and delay adjustment operations is shown in block diagram form. In a manner similar to that described above, a reference clock signal phi 76 is used to generate clock signals phiH 78 and phiL 80. The clock signal phiL 80 is generated from phi 76 via a level shift and via buffers that comprise the phiL clock tree (not shown). The clock signal phiH 78 is generated from phi 76 via an adjustable delay buffer 82 and via buffers 84 and 86 that comprise the phiH clock tree. Phase detectors 88 and 90 compare phiH 78 and phiL 80 and generate signals that control the delay of adjustable delay buffer 82.

Figure 6:
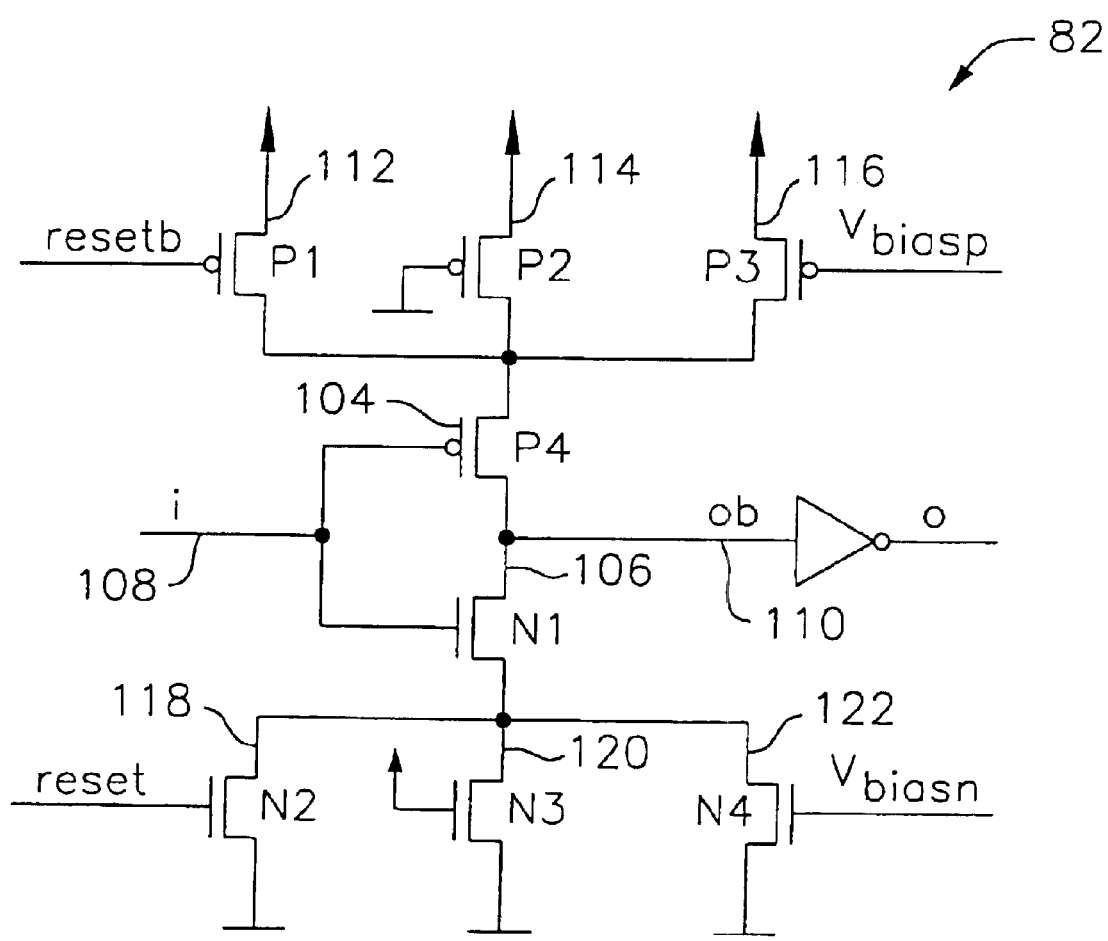
FIG. 6 is schematic diagram of one embodiment of an adjustable delay buffer circuit according to the invention.

The operation of the adjustable delay buffer 82 of FIG. 5 will be discussed in conjunction with FIGS. 6 and 7. FIG. 6 is a schematic diagram of one embodiment of the adjustable delay buffer 82 implemented in CMOS circuitry. The adjustable delay buffer has input "i" and output "o" and is controlled by bias voltages Vbiasp and Vbiasn that affect the charging and discharging current to an intermediate node of the adjustable delay buffer 82.

MOS transistors P4 104 and N1 106 form a basic inventor for inverting input 'i' 108 to generate 'ob' 110. Signal 'ob' 110 is inverted to produce the non-inverted output 'o' of the adjustable delay buffer. PMOS transistors P1 112, P2 114 and P3 116 supply currents for the rise time of the basic inverter. P2 114 supplies a constant current because it is always ON with a grounded gate, thus defining the maximum rise time for 'ob' 110 when P1 112 and P3 116 are both off. P1 112 is either OFF or ON depending on the state of the "resetb" signal and, when ON, provides an intermediate supply current to the inverter. In a preferred embodiment, the circuit is designed so that the current supplied when P1 112 and P2 114 are both on is in the middle of the regulation window that is covered by the adjustable delay buffer 82. P3 116 provides an adjustable current to the inverter depending on the value of Vbiasp. Preferably, the ON and OFF states of P1 112 and P3 116 are mutually exclusive.

N2 118, N3 120 and N4 122 operate in a similar way for sinking current for the falling edge of 'ob' 110. N3 120 sinks a constant current because it is always ON with its gate tied to a high voltage thereby defining the maximum fall time for 'ob' 110 when N2 118 and N4 122 are both off. N2 118 is either OFF or ON depending on the state of the "reset" signal (the compliment of resetb) and, when ON, provides an intermediate sinking current for the inverter. In a preferred embodiment, the circuit is designed so that the current sunk when N2 118 and N3 120 are both ON is in the middle of the regulation window that is covered by the adjustable delay buffer 82. N4 122 sinks an adjustable current to the inverter depending on the value of Vbiasn. Preferably, the ON and OFF states of N2 118 and N4 122 are mutually exclusive.

Through the use of the constant current transistors P2 114 and N3 120 and the reset signals, the adjustable delay buffer may be set to a maximum delay state or to a fixed intermediate delay state. In practice, the transistors P1 112 and N2 118 are dimensioned so that under typical operating conditions, the buffer provides enough delay so that the output of the two clock trees are aligned in phase.

Adjustable delay is provided by varying Vbiasp and Vbiasn. As these signals are varied, the rise time and fall time of the inverter is varied resulting in a variable delay between 'i' 108 and 'ob' 110.

Figure 7:
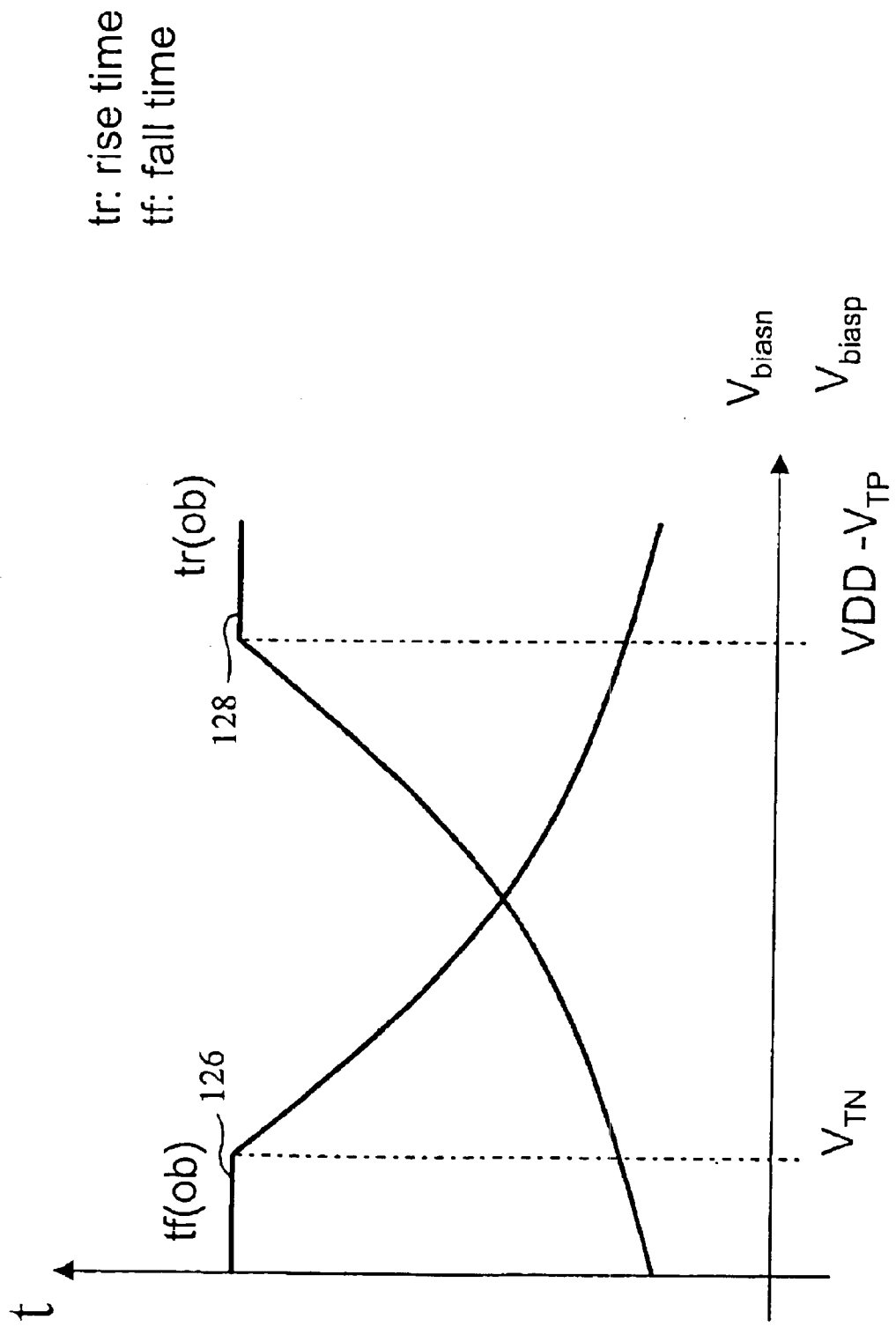
FIG. 7 is an exemplary graph of delay adjustments for the circuit of FIG. 6.

FIG. 7 is a graph representative of delay adjustments for the adjustable delay buffer 82 of FIG. 6. The vertical axis represents the rise times and fall times at "ob" 110. The horizontal axis represents the bias voltages Vbiasp and Vbiasn. VTN is the threshold voltage of an NFET. VTP is the threshold voltage of a PFET. In this example, the reset signals are inactive.

Curve tf(ob) 126 corresponds to Vbiasn. When Vbiasn is below $V_{TN}$ then the buffer 82 provides a constant delay for the falling edge because transistor N4 122 is off. As Vbiasn increases to values above $V_{TN}$ N4 122 turns on thereby providing more sink current for N1 106. As a result, the fall time of node "ob" 110 decreases.

Curve tr(ob) 128 corresponds to Vbiasp. When Vbiasp is above $V_{DD}-V_{TP}$ then the buffer 82 provides a constant delay for the rising edge because transistor P3 116 is off. As Vbiasn decreases to values below $V_{DD}-V_{TP}$ P3 116 turns on thereby providing more source current for P4 104. As a result, the rise time of node "ob" 110 decreases.

Figure 8A:
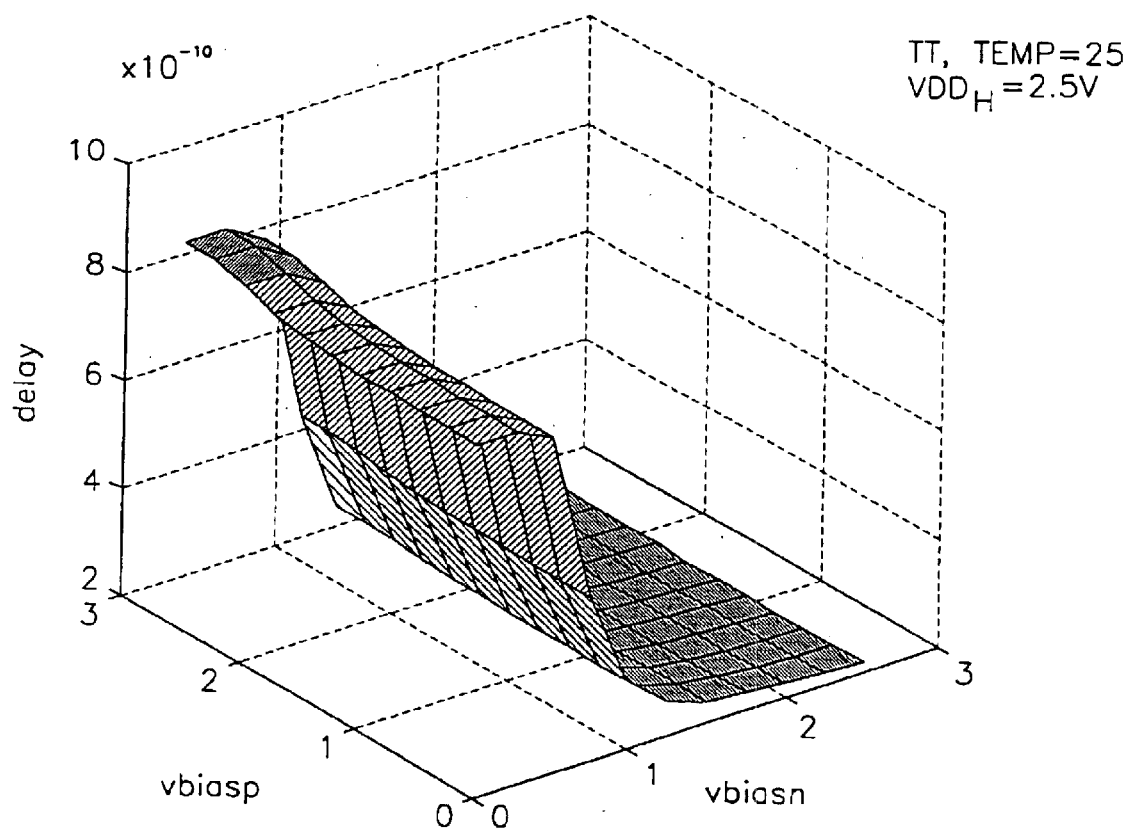
FIGS. 8A–8D are exemplary simulation results for the circuit of FIG. 6.
Figure 8B:
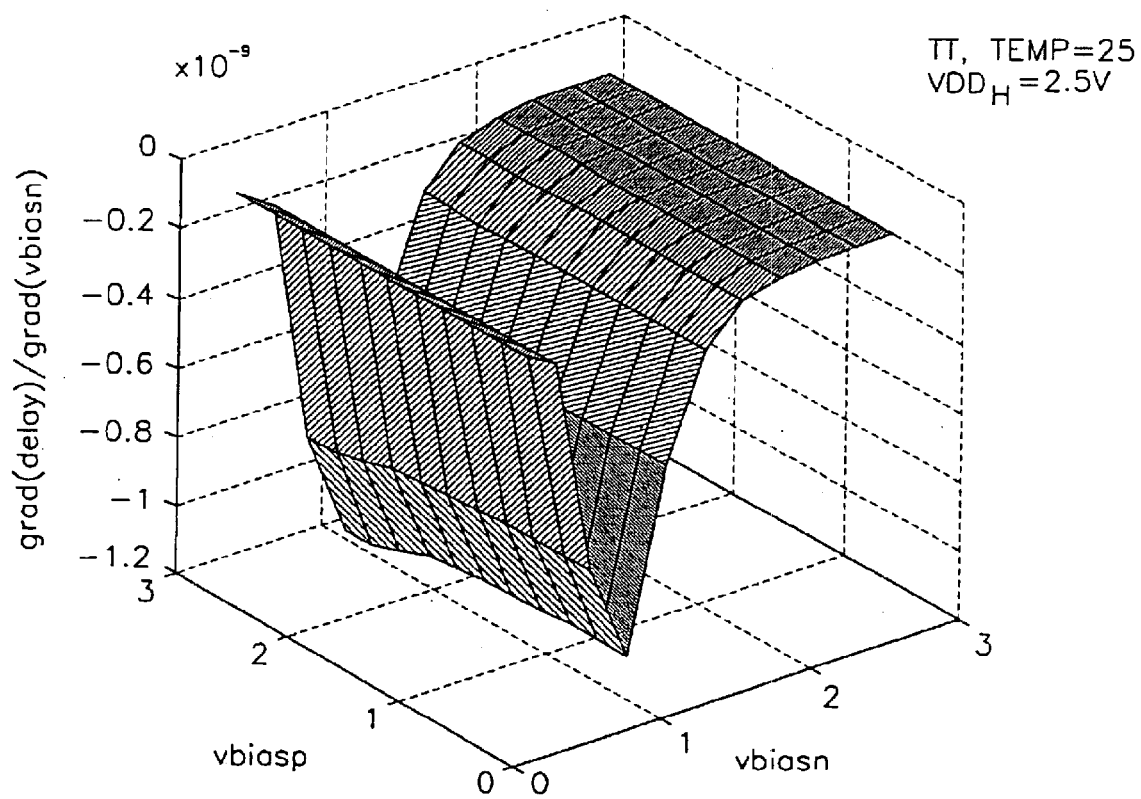
Figure 8C:
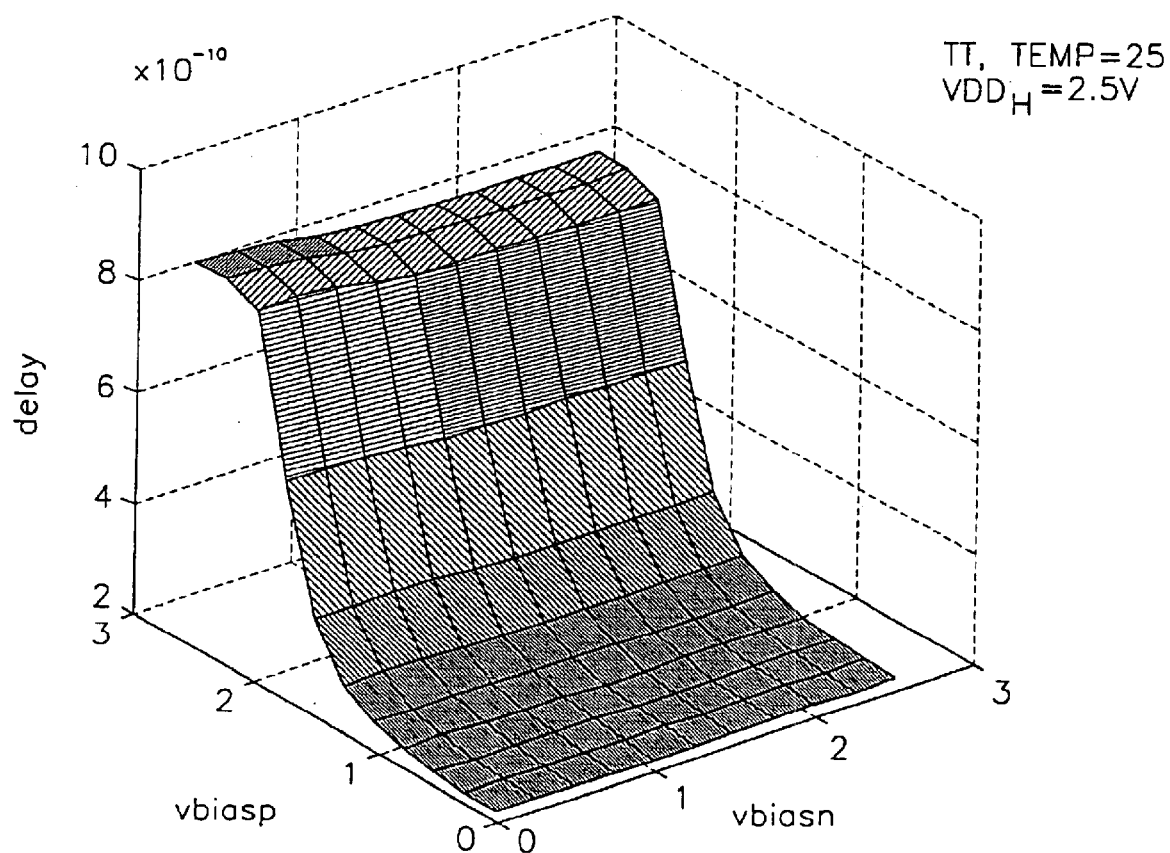
Figure 8D:
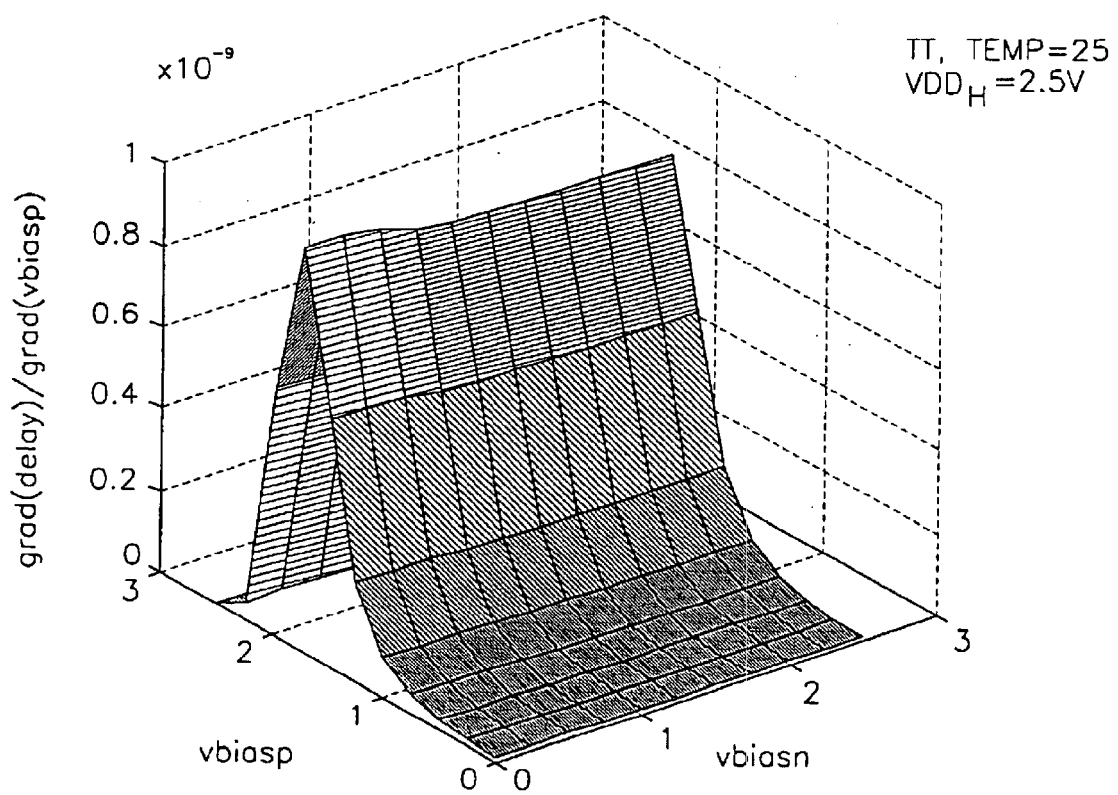

FIGS. 8A–8D depict simulation results for the delays under typical conditions. FIG. 8A illustrates the delay for the rising edge. FIG. 8B illustrates the delay sensitivity (i.e., the gradient of the delay curve: gradient delay over gradient bias voltage) for the rising edge. FIG. 8C illustrates the delay for the falling edge. FIG. 8D illustrates the delay sensitivity for the falling edge.

Referring again to FIG. 5, the generation of Vbiap and Vbian will be treated in detail. The phi signal 76 is fed through the adjustable delay buffer 82 and then through buffers 84 and 86 to generate phiH 78. The signal phiH 78 is used to clock the two phase detectors PDTF1 88 (clocked on the falling edge of phiH) and PDTR2 90 (clocked on the rising edge of phiH). The signal phiL 80 is used as the data signal to both of the phase detectors PDTF1 88 and PDTR2 90.

The phase detector for the falling edge, PDTF1 88, generates a control signal (early) which is one of two inputs to a NAND gate 140. The resetb signal is the other input to the NAND gate 140. The digital output of NAND gate 140 is fed to a low pass filter (consisting of R1 142 and C1 144) to generate the Vbiasp signal as an analog value.

Typically, Vbiasp may stay high for several cycles until the phase detector 88 detects that the clock signal phiH is no longer earlier than the input signal phiL. At this point, the phase detector 88 switches the early signal to its opposite value. When this happens, the voltage induced on the capacitor C1 144 reverses. Thus, the value of Vbiasp will vary back and forth in relatively small intervals. The NAND gate 140 functions to keep the ON and OFF state of the transistors P1 112 and P3 116 in FIG. 6 mutually exclusive.

Vbiasn is generated in a similar fashion using the rising edge phase detector PDTR2 90 to control a NOR gate 146 and the low pass filter consisting of resistor R2 148 and capacitor C2 150. The phase detector for the rising edge, PDTR2 90, generates a control signal (late) which is one of two inputs to NOR gate 146. The resetb signal is the other input to the NOR gate 146. The digital output of NOR gate 146 is fed to a low pass filter (consisting of R2 148 and C2 150) to generate the Vbiasn signal as an analog value.

Typically, Vbiasn may stay high for several cycles until the phase detector 90 detects that the clock signal phiH is no longer later than the input signal phiL. At this point, the phase detector 90 switches the early signal to its opposite value. When this happens, the voltage induced on the capacitor C2 150 reverses. Thus, the value of Vbiasn will vary back and forth in relatively small intervals. The NOR gate 146 functions to keep the ON and OFF state of the transistors N2 118 and N4 122 in FIG. 6 mutually exclusive.

Figure 9:
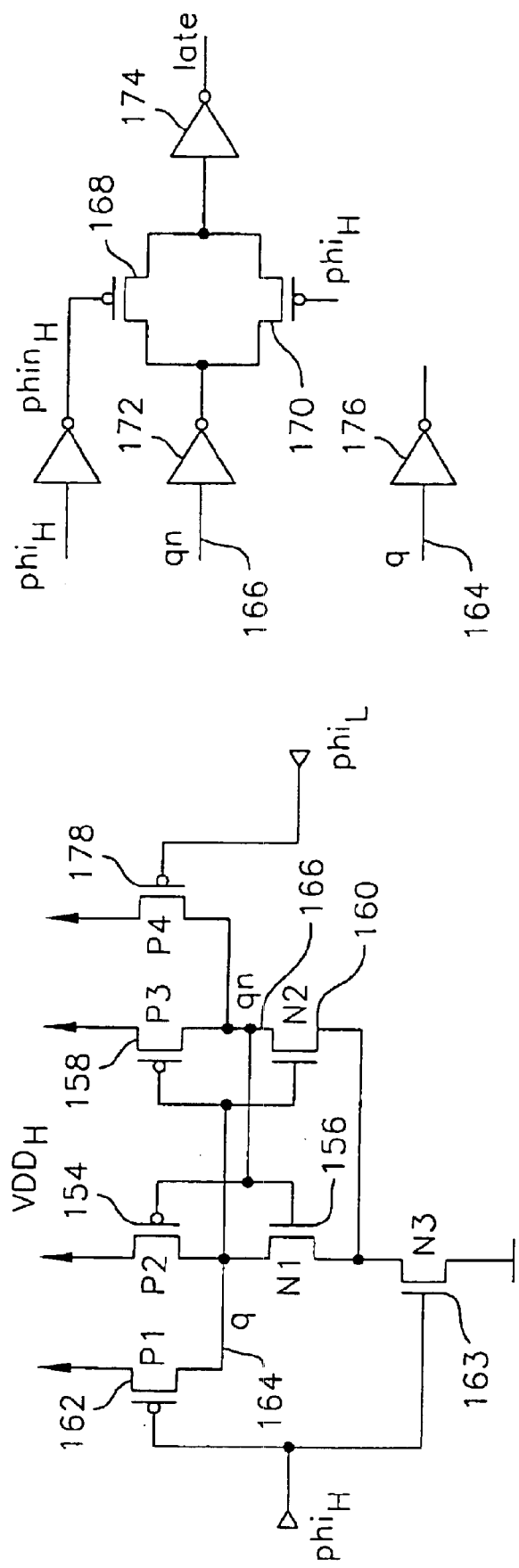
FIG. 9 is a circuit diagram of one embodiment of a rising edge phase detector constructed according to the invention.
Figure 10:
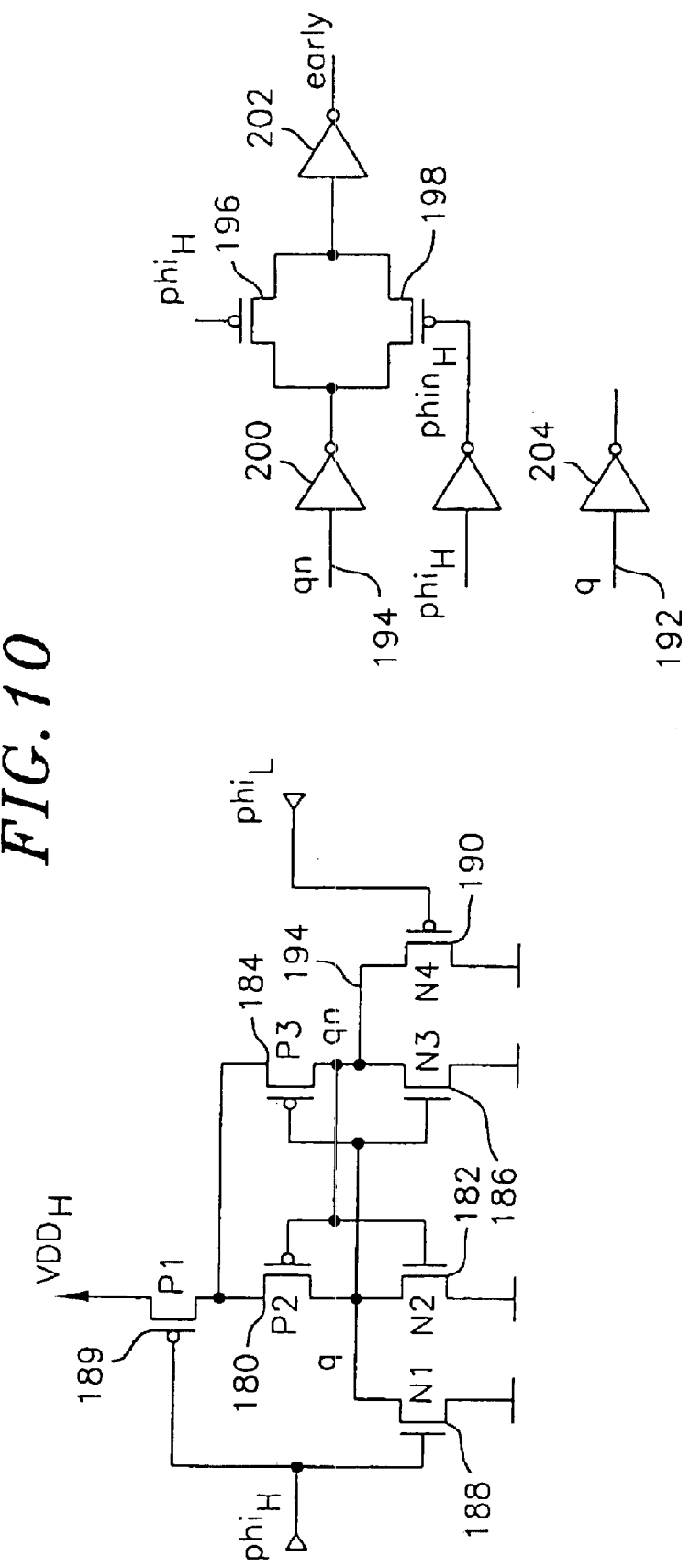
FIG. 10 is a circuit diagram of one embodiment of a falling edge phase detector constructed according to the invention.

FIGS. 9 and 10 are circuit diagrams of one embodiment of the phase detectors 90 and 88 for the rising edge and the falling edge, respectively. Referring to FIG. 9, this circuit generates the late signal when phiH rises before phiL. Transistors P2 154 and N1 156 and transistors P3 158 and N2 160 form a latch. Transistors P1 162 and P4 178 are used to evaluate the clock signals, phiH and phiL. Depending on which clock signal transitions first, the latch outputs q 164 and qn 166 will be at a 1 or a 0 state, respectively.

Switch transistors 168 and 170 and the two invertors 172 and 174 form a register. Because the latch is pre-charged, the pre-charge state could potentially become the output. To avoid this, the output (qn) 166 is clocked through the register to generate the "late" signal. When the latch is precharging, the connection to the register is, in effect, broken so that the register only stores the value of the previous evaluation by the latch, not the precharge value. The inverter 176 is used to provide the same load on output q 164 as is present on output qn 166.

Referring now to the falling edge detector 88 in FIG. 10, this circuit generates the early signal when phiL falls before phiH. Transistors P2 180 and N2 182 and transistors P3 184 and N3 186 form a latch. Transistors N1 188 and N4 190 are used to evaluate the clock signals, phiH and phiL. Depending on which clock signal transitions first, the latch outputs q 192 and qn 194 will be at a 1 or a 0 state, respectively.

Switch transistors 196 and 198 and the two invertors 200 and 202 form a register for reasons similar to those discussed above in conjunction with FIG. 9. Similarly, inverter 204 is used to provide the same load on output q 192 as is present on output qn 194.

Figure 11:
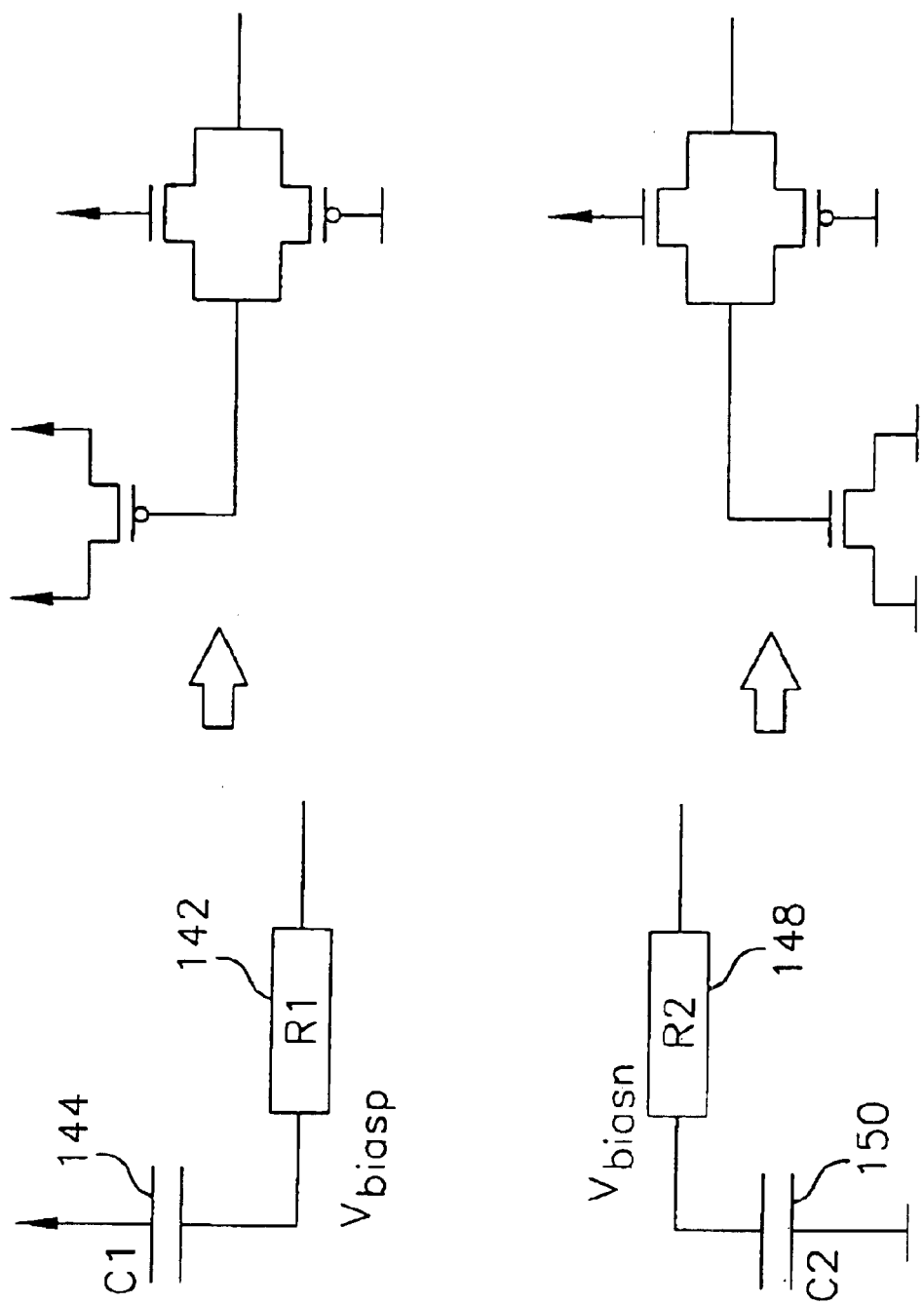
FIG. 11 is a circuit diagram of one embodiment of low pass filters for the circuit of FIG. 5.

FIG. 11 shows an exemplary implementation for the low pass filters R1 142 and C1 144 and R2 148 and C2 150, using CMOS technology. That is, the circuits on the right side of FIG. 11 are the CMOS implementations of the RC circuits depicted on the left side of FIG. 11.

Figure 12:
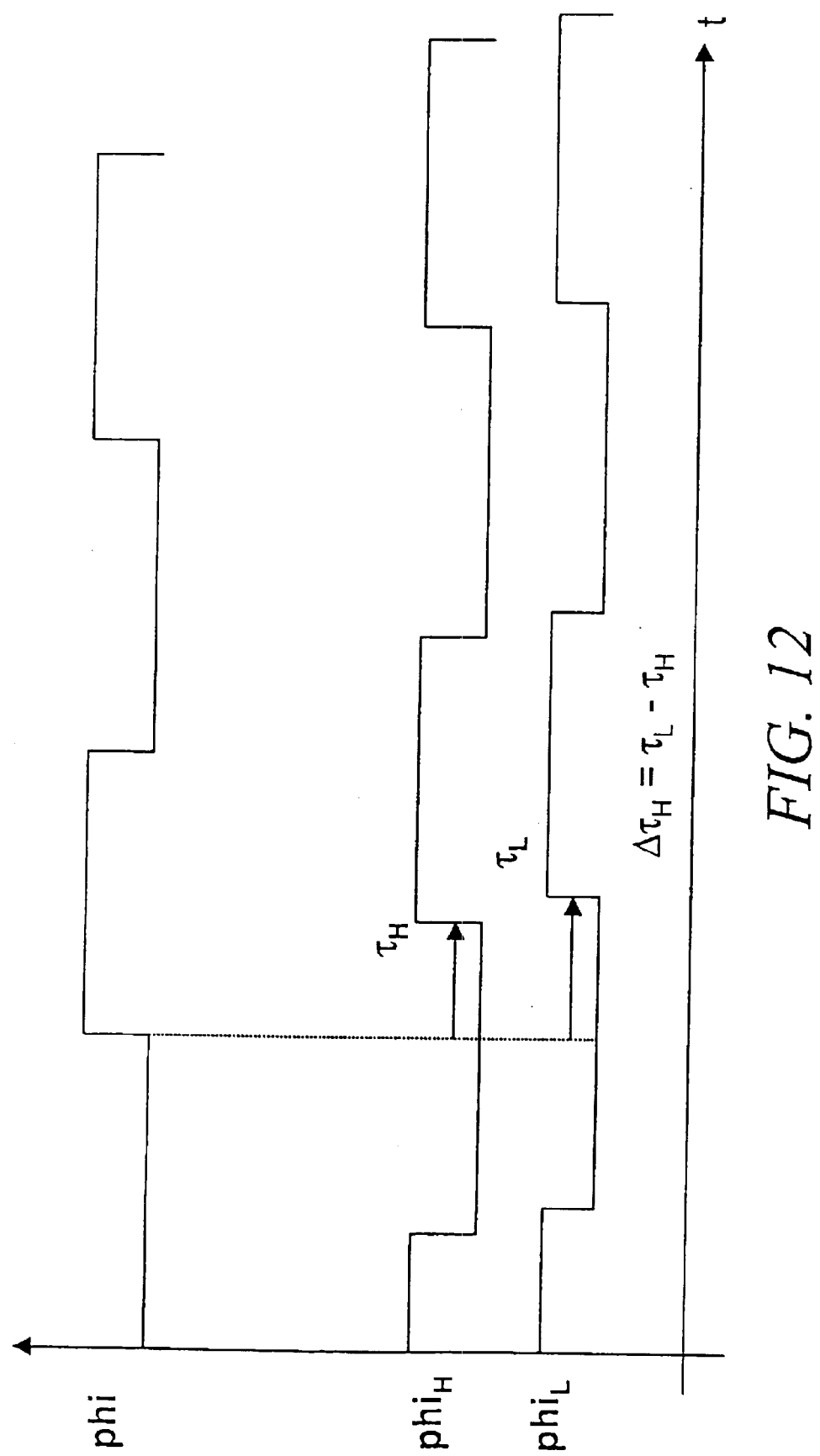
FIG. 12 is an exemplary timing diagram for the analog delay locked loop circuit of FIG. 5.

FIG. 12 depicts a delay measurement ($\Delta\tau_H$) for an exemplary analog DLL where there is a mismatch between the delay for phiH and phiL. In operation, the analog DLL described herein will adjust $\tau_H$ to match $\tau_L$ ($\Delta\tau_H=0$). It will be understood by those skilled in the art that the accuracy with which the analog DLL can match $\tau_H$ to $\tau_L$ depends on a variety of factors including, for example, circuit characteristics, operating condition and manufacturing tolerances. In general, while the goal is to obtain a perfect match at all times between $\tau_H$ and $\tau_L$, in practice this match will be somewhat less than exact.

Figure 13A:
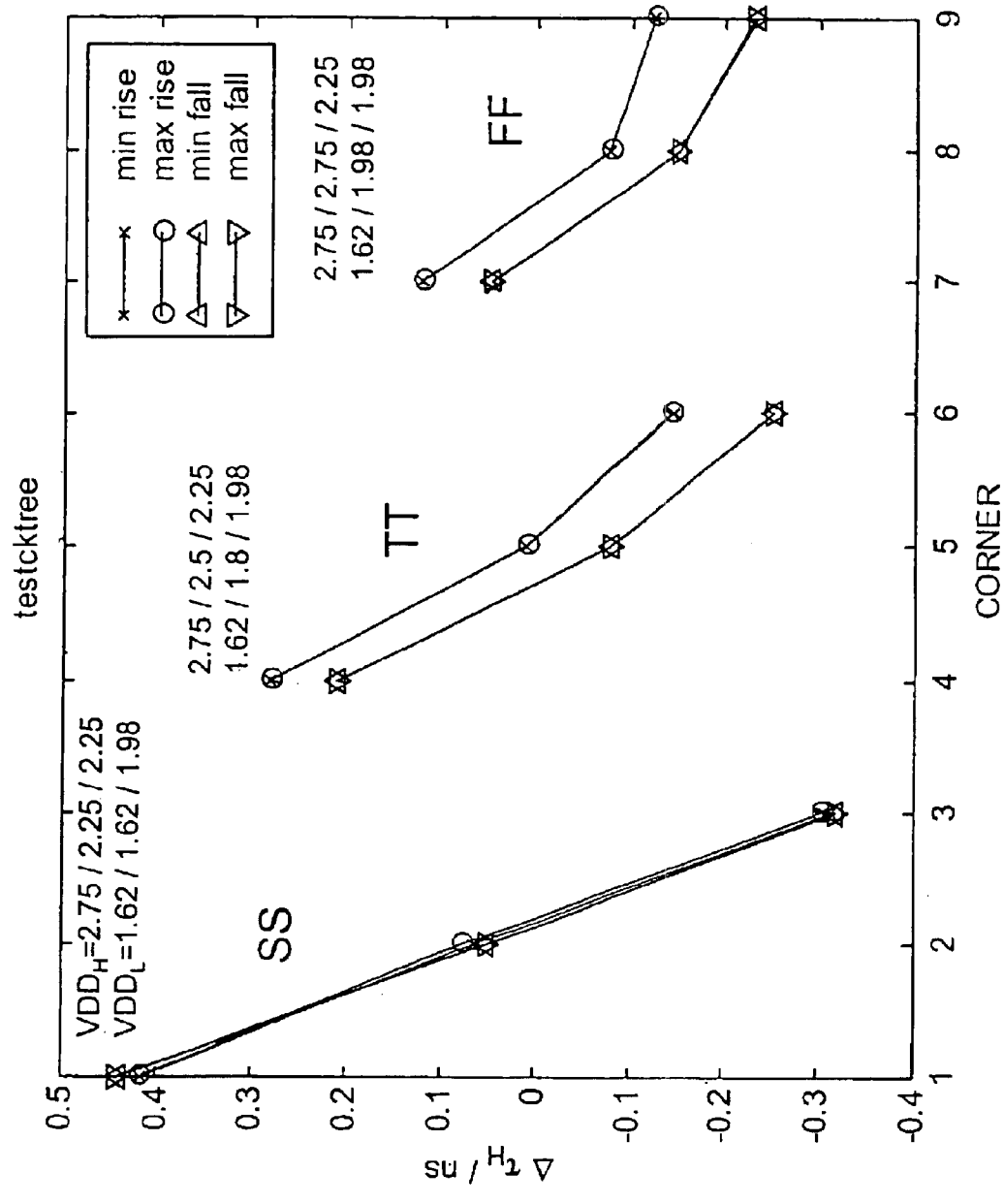
FIGS. 13A–13E are exemplary simulation results for the analog delay locked loop circuit of FIG. 5.
Figure 13B:
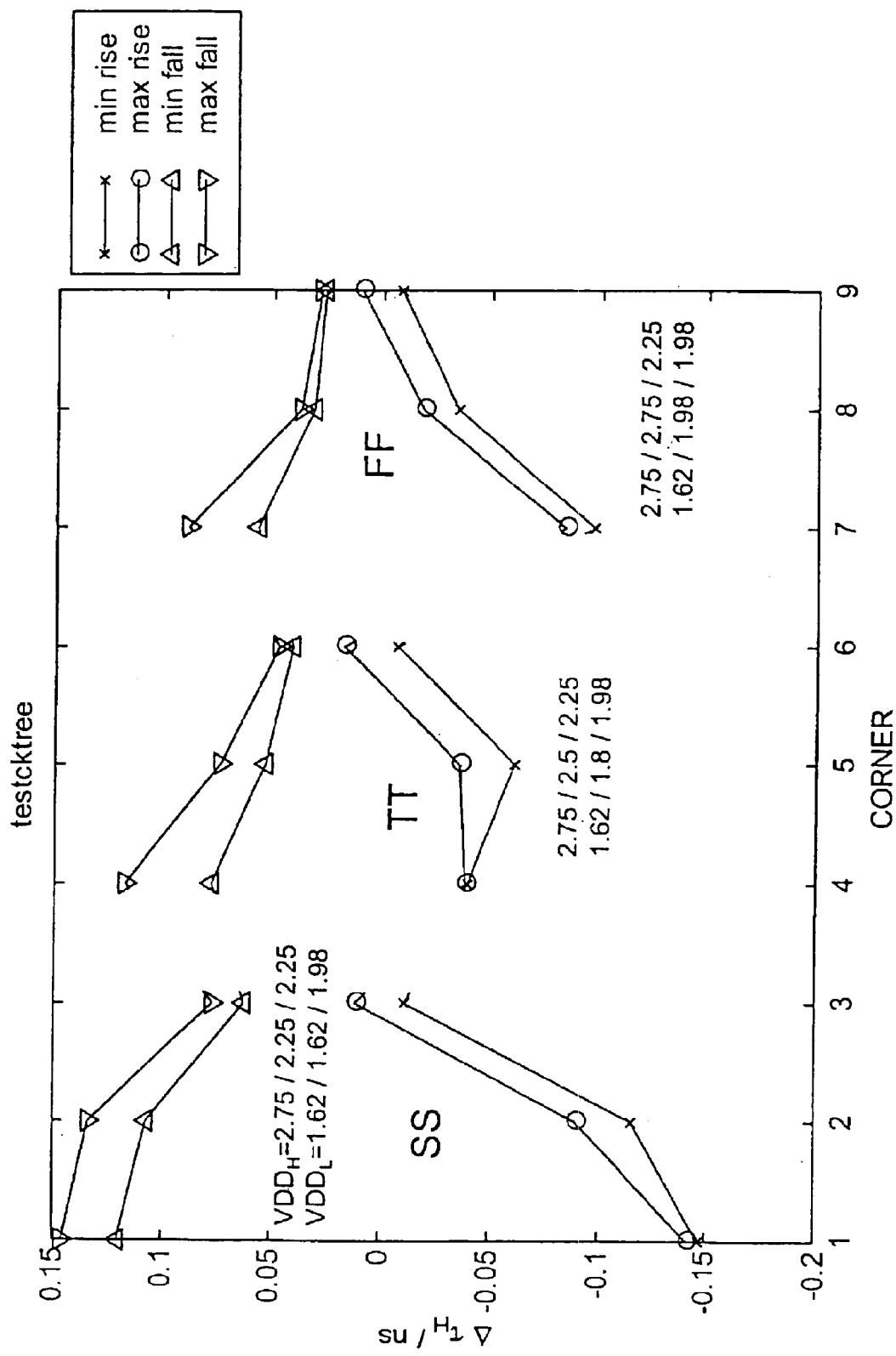
Figure 13C:
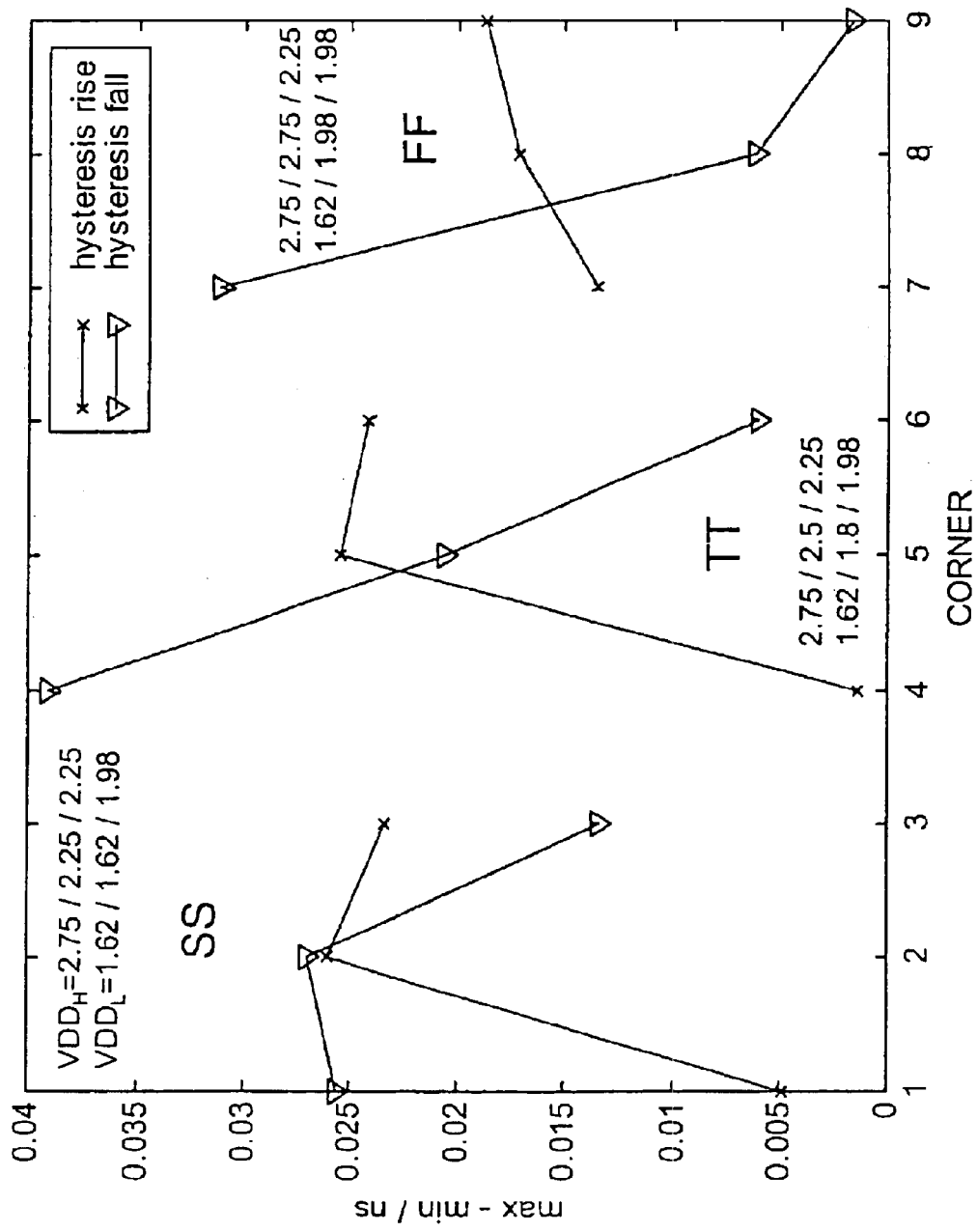
Figure 13D:
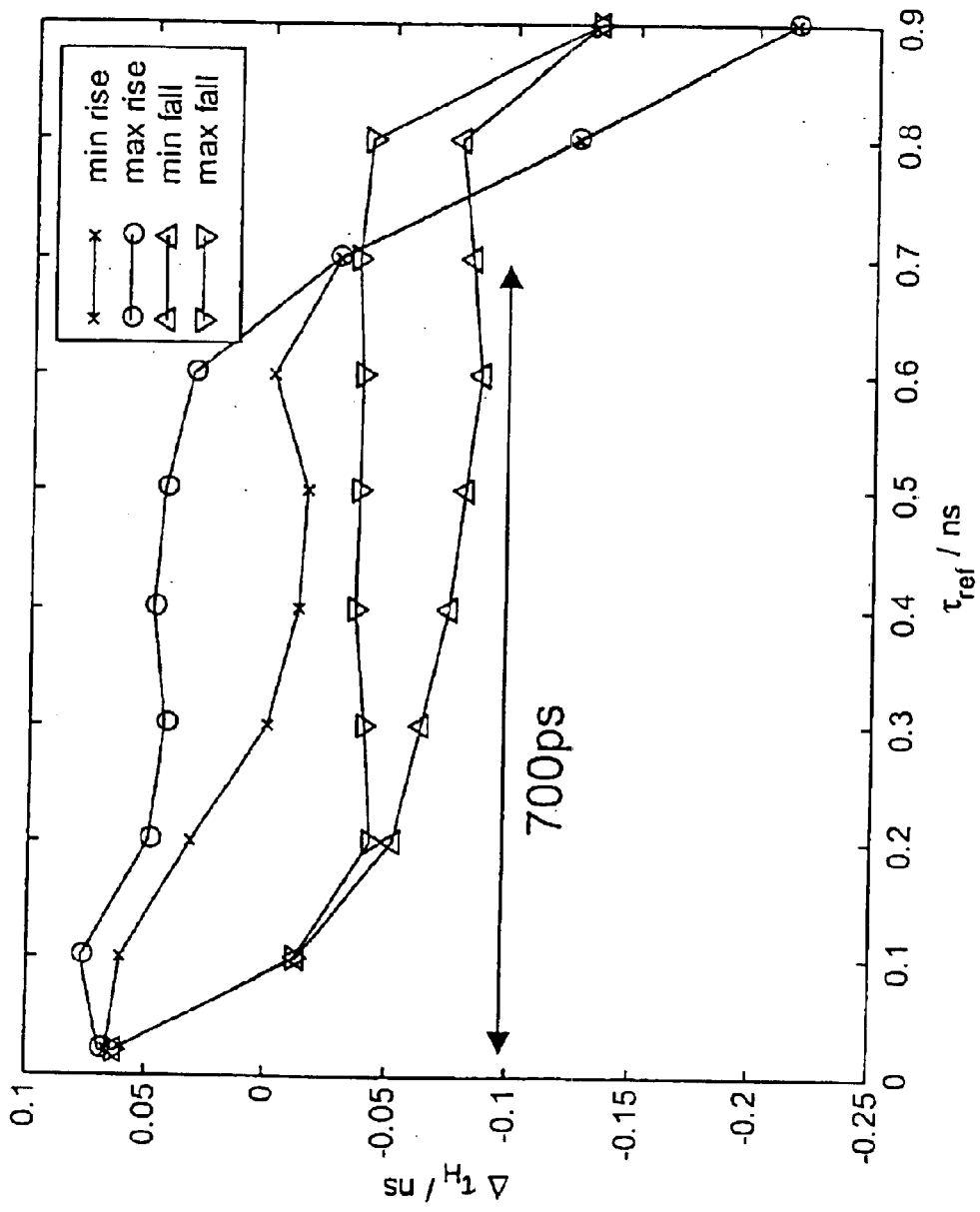
Figure 13E:
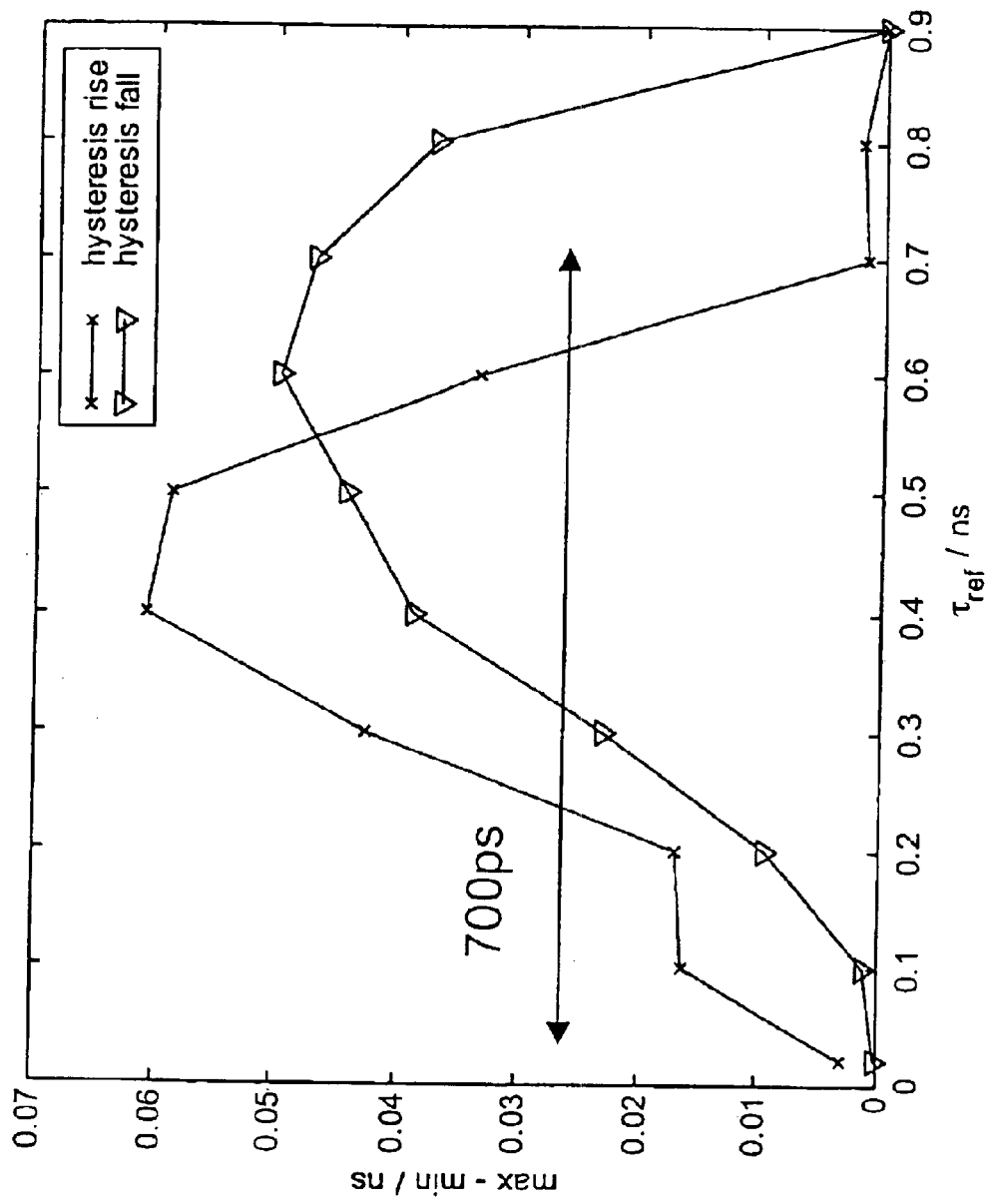

FIGS. 13A–13E show simulation results for different states of an exemplary analog DLL. FIG. 13A depicts a buffer mismatch (the values of $\Delta\tau_H$ for several corner conditions) when reset is set to a "1." FIG. 13B depicts a buffer mismatch when reset is set to a "0." FIG. 13C depicts buffer mismatch hysteresis for several corner conditions when reset is set to a "0." FIG. 13D depicts tracking range under the conditions VDDH=2.5V, VDDL=1.8V at corner TT and a temperature of 25° C. FIG. 13D depicts tracking hysteresis under the conditions VDDH=2.5V, VDDL=1.8V at corner TT and a temperature of 25° C.

Figure 14:
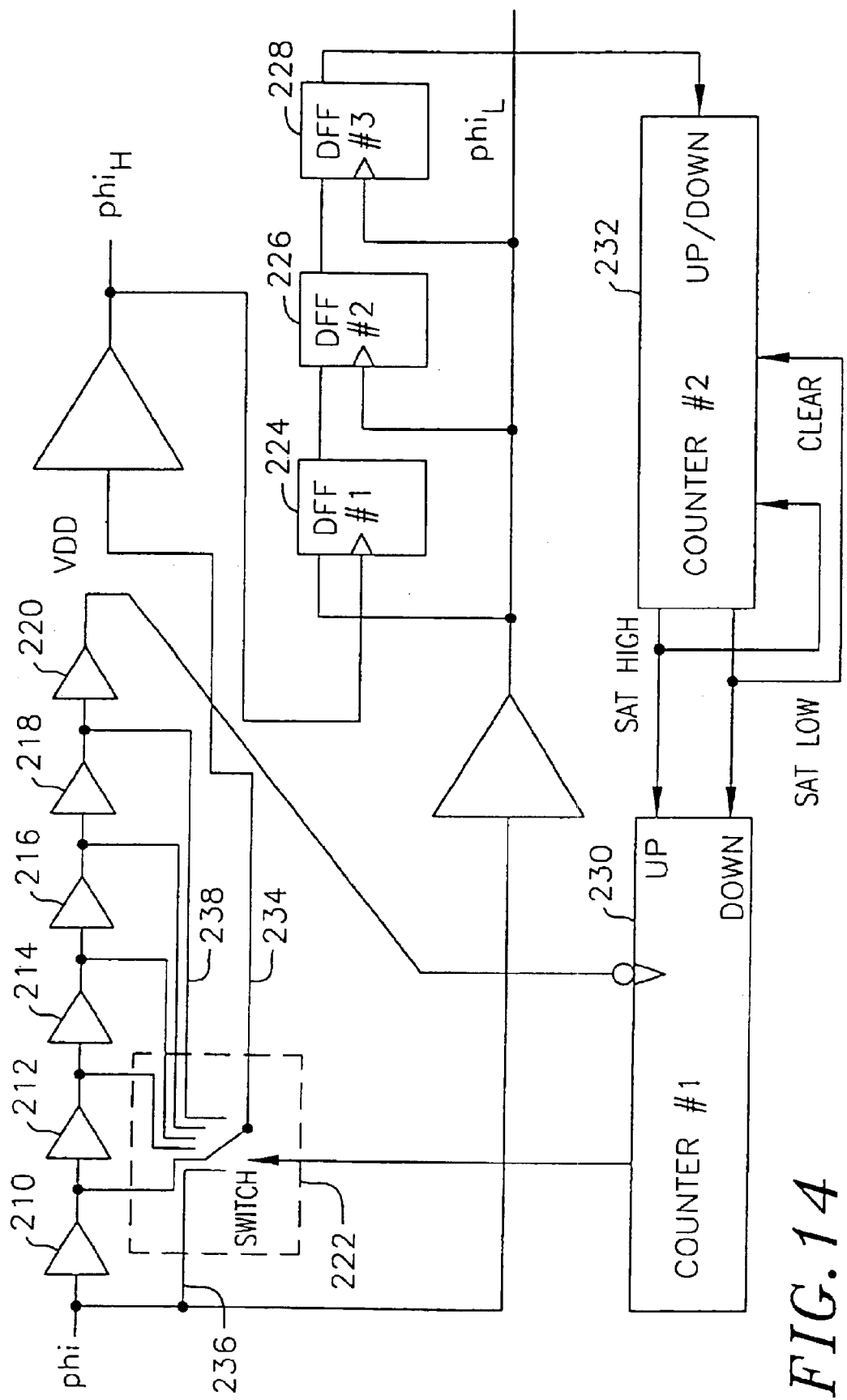
FIG. 14 is a block diagram of one embodiment of a digital delay locked loop constructed according to the invention.

Referring now to FIG. 14, this figure describes another embodiment of the invention wherein a digital delay locked loop ("DLL") is used to compensate for the phase variations of two clocks, phiH and phiL. In this circuit, several buffers 210, 212, 214, 216 and 218 are used to generate delayed versions of the input clock signal phi. A selector switch 222 selects the one delayed clock signal that provides the best match to the desired phase of the output clock. In other words, selector switch 222 controls the delay of phiH to match the phase of phiL by selecting a version of the clock signal phi that has passed through as few as none (switch 222 connects output lead 234 to input lead 236) and as many as five (switch 222 connects output lead 234 to input lead 238) of the buffers 210–218. Flip-flop DFF1 224 performs the function of a phase detector. Flop-flops DFF2 226 and DFF3 228 are signal stabilizers that help resolve meta stability conditions that exist due to the circuit driving DFF1 224 so that phiH clocks the DFF1 224 when phiL is in transition. Counter1 230 controls the position of the selector switch 222 based on the phase difference between phiH and phiL. Counter2 232 is, in effect, a low pass filter that reduces jitter in the circuit so that the jitter does not effect the position of the selector switch 222.

Basically, each transition of the clock signal output is a phase measurement and this results in a high or low output by DFF3 228 that feeds to counter1 230 through the low pass filter (counter2 232). When the phases of the phiH and phiL are equal, the output of DFF3 228 will toggle thereby setting counter2 232 to alternate between counting up and counting down. In this case, the output of counter2 will not saturate in either the high or low direction. As a result, counter1 230 will not change the position of the selector switch 222. In the event of a phase mismatch between phiH and phiL, counter2 232 may eventually saturate (high or low) at some defined value which will cause counter1 230 to change the position of the selector switch 222.

The minimum resolution of this digital delay lock loop is limited to the delay of one buffer. In practice, this resolution may be too large to provide adequate delay compensation in certain circuits.

Figure 15:
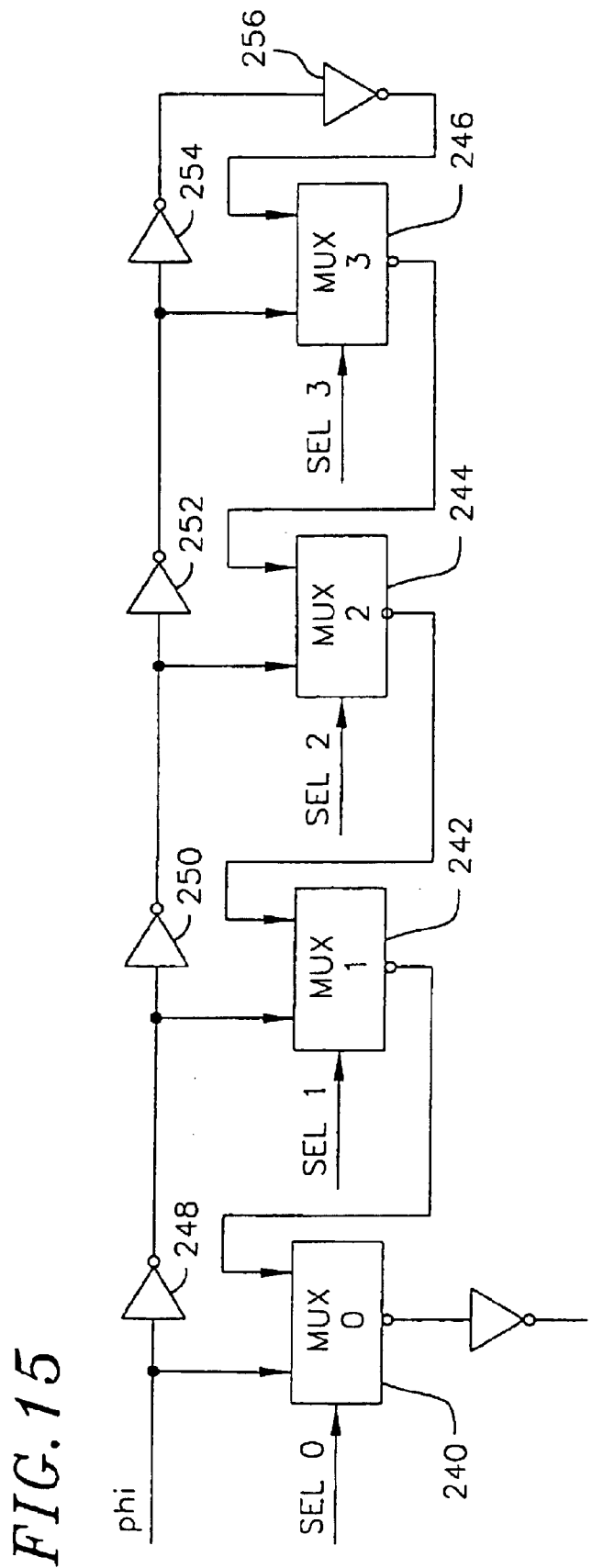
FIG. 15 is a block diagram of an alternative embodiment of a circuit for implementing a variable delay in a digital delay locked loop.

FIG. 15 is block diagram of an alternative embodiment of a circuit for implementing a variable delay in a digital scheme. For example, the circuit of FIG. 15 could replace the buffers 210–218 and the selector switch 222 of FIG. 14. The delay in this circuit is controlled by selecting the path of the input signal phi though the multiplexors ("Muxs") 240, 242, 244 and 246 and the inverters 248, 250, 252, 254 and 256. Muxs 240, 242, 244 and 246 may, in general, be selected by the output of counter1 in FIG. 14 (e.g., using a thermometer code). The next shortest signal path through this structure is through Mux0 240. The next selection has a delay that results from propagation through inverter 248, Mux1 242 and Mux0 240. Therefore, incremental delays can be added by going one step to the right through an additional inverter and the corresponding Mux delay. The advantage of this structure is that the select switch does not have to be balanced as it typically would be in the embodiment of FIG. 14. When the signal is switched from one path to the next path, only an inverter and a Mux delay are added.

The minimum resolution of this circuit typically is limited to the delay of a Mux plus an inverter. For example, in one embodiment, with operating conditions of VDD=2.5V, SS corner, temperature=25° C., the delay is quantized to approximately 0.35 nS. Thus, the delay is slightly longer than the one buffer delay described in conjunction with FIG. 14.

However, in one embodiment of the invention, the phase error between phiH and phiL is approximately +/−400 picoseconds ("pS") with changes in VDD of +/−10%. The phase error is approximately +/−200 pS with changes in VDD of +/−5%. Thus, the resolution of the embodiments of the digital DLL described above is not small enough to provide effective delay compensation in this case. In sum, for practical application of the digital DLL, it is important to select delay components that have sufficiently small delay, e.g., appreciably smaller than the maximum phase error between phiH and phiL.

A comparison of the analog DLL and the digital DLLs described above illustrate that the analog DLL may be preferable to the digital DLL in many circumstances. For example an analog DLL that aligns the rising and falling edges is preferable to a digital design that aligns only one edge (e.g., the rising edge). Clock jitter (e.g., $\tau_{hyst}$) in one embodiment of the analog DLL is approximately 0.06 nS. In one of the digital embodiments, the clock jitter was approximately 0.35 nS. Also, in the digital DLL delay is quantized (e.g., 0.35 nS) while the analog DLL can, in effect, continuously track changes in the delay. In addition, the digital DLL may consume more power than the analog DLL due to switching activity that may occur in digital DLL implementations. In sum, the analog DLL may provide better performance at a lower cost.

Figure 16:
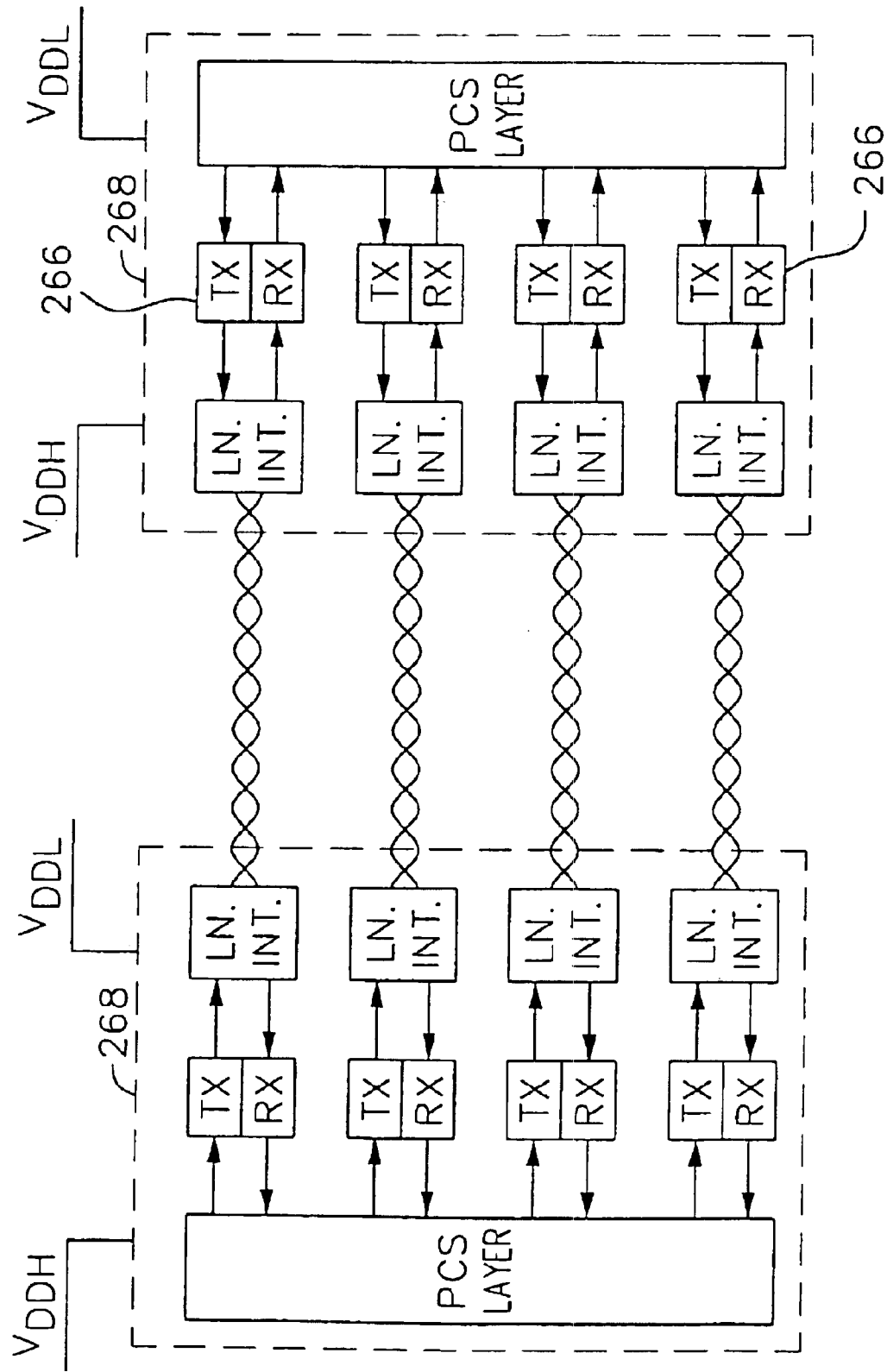
FIG. 16 is a simplified block diagram of one embodiment of a high-speed bidirectional communication system.

Referring to FIG. 16, in one embodiment a circuit constructed according to the invention is implemented as an integrated circuit-based bidirectional communication system. In this case, the present invention may be characterized as a system and method for accommodating efficient, high speed decoding of signal samples encoded according to the trellis code specified in the IEEE 802.3ab standard (also termed 1000BASE-T standard). The physical implementation of this embodiment is a gigabit ethernet transceiver chip 266 that is installed on a transceiver circuit board 268. The decoder circuitry portions of transceiver demodulation blocks require a multiplicity of operational steps to be taken in order to effectively decode each symbol. Such a multiplicity of operations is computationally complex and may push the switching speeds of integrated circuit transistors which make up the computational blocks to their fundamental limits. Consequently, the transceiver chip 266 may use multiple supply voltages to reduce the power dissipation of the integrated circuit.

Figure 17:
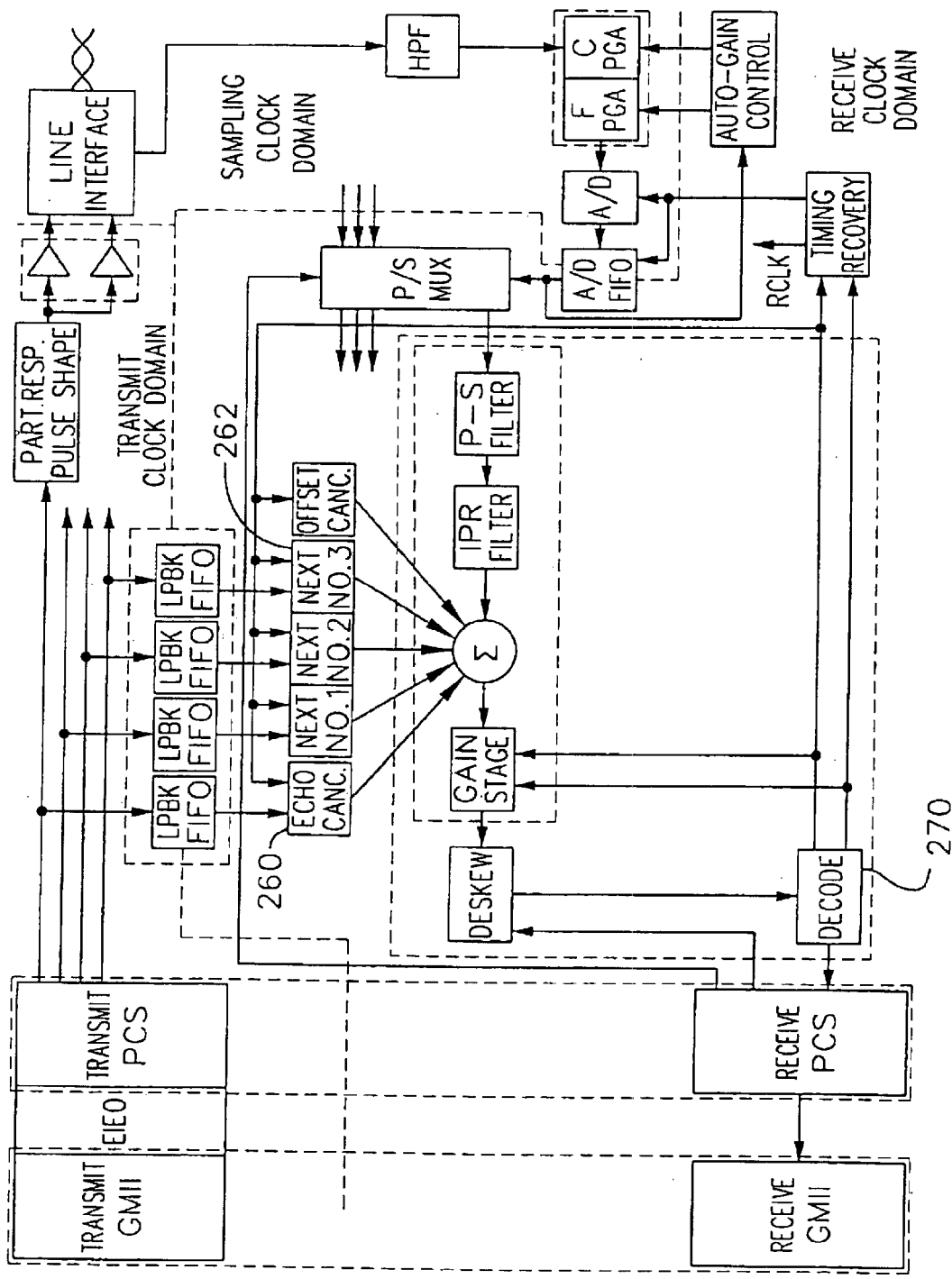
FIG. 17 is a simplified block diagram of one embodiment of a giga-bit transceiver integrated circuit incorporating clock delay compensation according to the invention.

FIG. 17 is a simplified block diagram of the functional architecture and internal construction of the transceiver chip 266 and other portions of the transceiver board 268. In one embodiment of this implementation, circuits such as echo canceller 260 and near-end crosstalk ("NEXT") cancellers 262 may be operated at a lower supply voltage than some of the other circuits in the transceiver chip. In this case, a lower supply voltage powers the components that generate the clock signals for clocking the Echo/NEXT cancellers. In accordance with the invention, a timing recovery circuit 258 may incorporate phase compensation to reduce phase mismatches between the clocks sent to the echo cancellers 260 and the NEXT cancellers 262 and the clocks sent to other circuits in the transceiver chip 266.

Figure 18:
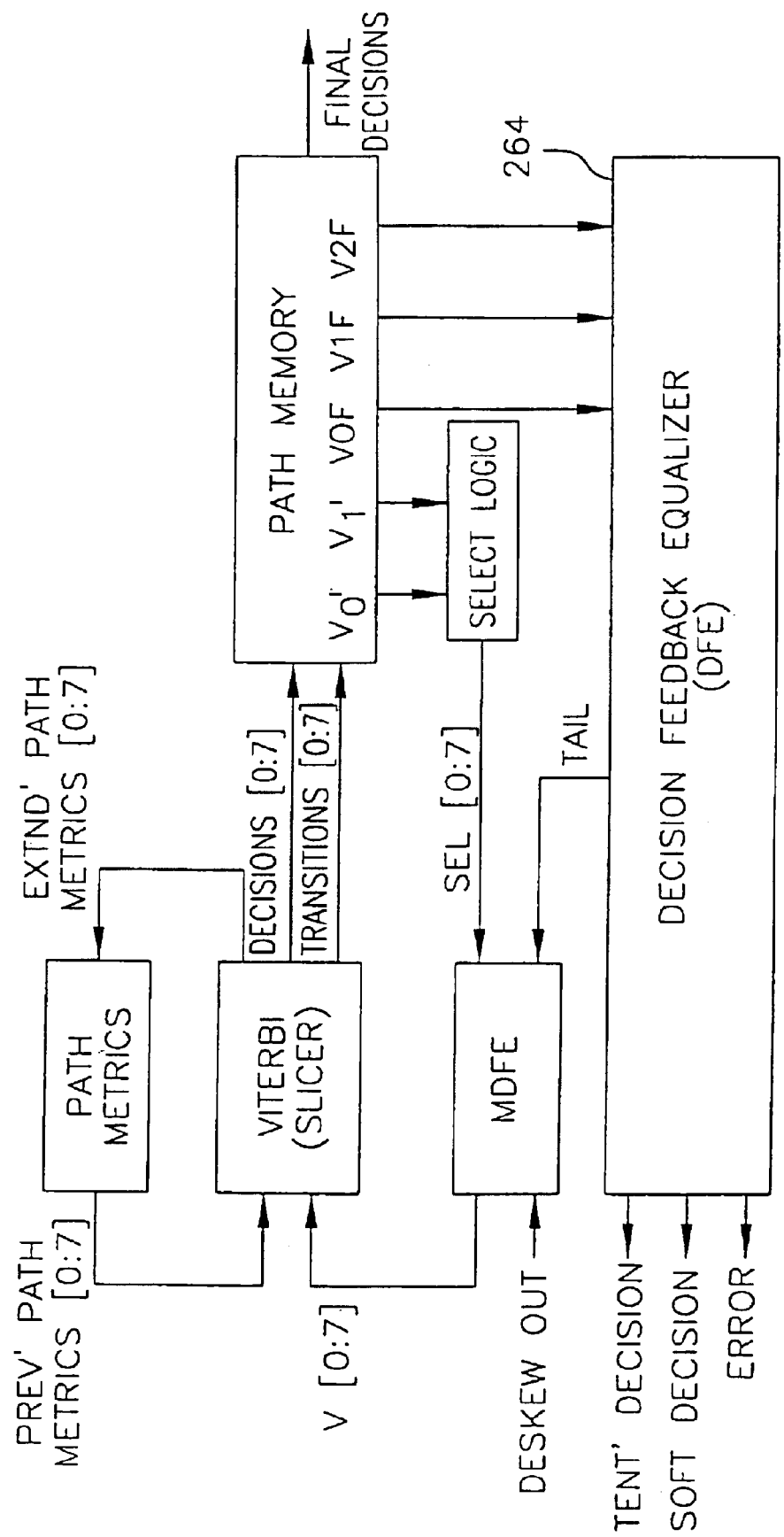
FIG. 18 is a simplified block diagram of one embodiment of a trellis decoder circuit incorporated in the integrated circuit of FIG. 17.

FIG. 18 is a simplified block diagram of some of the trellis decode functionality from decode block 270 in the transceiver chip 266. The decode functionality includes a decision feedback equalizer 264 ("DFE") that may be operated at a lower supply voltage than some of the other circuits in the transceiver chip 266. In this case, a lower supply voltage powers the components that generate the clock signals for clocking the DFE 264. As discussed above, the timing recovery circuit 258 may incorporate phase compensation to reduce phase mismatches between the clocks sent to the DFE 264 and the clocks sent to other circuits in the transceiver chip 266.

In summary, the invention described herein provides an effective technique for compensating for phase mismatches that may occur as a result of variations in power supply outputs. While certain exemplary embodiments have been described in detail and shown in the accompanying drawings, it is to be understood that such embodiments are merely illustrative of and not restrictive of the broad invention. It will thus be recognized that various modifications may be made to the illustrated and other embodiments of the invention described above, without departing from the broad inventive scope thereof.

For example, a variety of circuits may be used to implement analog DLLs and digital DLLs in accordance with the invention. The invention may be embodied in many different forms, for example, in virtually any type of integrated circuit. That is, the teachings of the invention are not limited to any particular integrated circuit function or structure. Moreover, such an integrated circuit could be used in a variety of devices such as transceiver boards 268 in personal computers, network interface cards and network infrastructure switches. It should be understood by one skilled in the art, given the teachings of the invention, that the operating characteristics of the analog and digital DLLs will depend on circuit parameters and operating conditions.

In addition, it would be apparent to one skilled in the art based on the description herein that the teachings of the invention may be applied to circuits that incorporate any number of supply voltages and clocks. For example, in the case where three supply voltages are used in the system S of FIG. 1, a third clock tree and level shifter (not shown) could be used to supply the clock signals to a third circuit (e.g., circuit C, not shown). In addition, another delay adjust circuit could be used in circuit B or C. In this case, the signal comparator also would compare the output of the third clock tree to control the delay adjust circuits so that the clocks for all three of the circuits are closely synchronized.

In view of the above it will be understood that the invention is not limited to the particular embodiments or arrangements disclosed, but is rather intended to cover any changes, adaptations or modifications which are within the scope and spirit of the invention as defined by the appended claims.

What is claimed is:

1. A system for generating clock signals, comprising:
   first clocking circuitry operable to generate a first clock signal, the first clocking circuitry operating at a first operating voltage;
   second clocking circuitry operable to generate a second clock signal, the second clocking circuitry operating at a second operating voltage;
   a phase a phase comparator operable to receive the first and second clock signals and to compare a phase of the first clock signal with a phase of the second clock signal and to generate a compensation signal indicative of a phase difference between the first and second clock signals; and
   a delay adjuster configured to receive the compensation signal and operable to delay the first clock signal to compensate for the phase difference between the first and second clock signals.

2. The system of claim 1 wherein the delay adjuster comprises at least one adjustable delay buffer.

3. The system of claim 1 wherein the phase comparator comprises:
   a rising edge phase comparator for comparing a rising edge of the first clock signal with a rising edge of the second clock signal, for generating at least one rising edge compensation signal indicative of a phase difference between the rising edge of the first clock signal and the rising edge of the second clock signal; and
   a falling edge phase comparator for comparing a falling edge of the first clock signal with a falling edge of the second clock signal, for generating at least one falling edge compensation signal indicative of a phase difference between the falling edge of the first clock signal and the falling edge of the second clock signal.

4. The system of claim 3 wherein the delay adjuster:
   delays the rising edge of the first clock signal in response to the rising edge compensation signal; and
   delays the falling edge of the first clock signal in response to the falling edge compensation signal.

5. The system of claim 2 wherein the at least one adjustable delay buffer comprises:
   at least one buffer transistor for buffering the first clock signal; and
   at least one control transistor, responsive to the compensation signal, for adjusting current flow through the at least one buffer transistor for controlling delay of the first clock signal through the at least one buffer transistor.

6. The system of claim 1 wherein the first clocking circuitry comprises a first clock tree and the second clocking circuitry comprises a second clock tree.

7. The system of claim 6 wherein the first clock tree comprises a plurality of buffers for generating the first clock signal and the second clock tree comprises a plurality of buffers for generating the second clock signal.

8. The system of claim 1 further comprising at least one power supply for providing the first operating voltage and the second operating voltage.

9. The system of claim 1 wherein the first clock signal and the second clock signal are derived from a common clock signal.

10. The system of claim 1 wherein the first clock signal drives a first circuit operating at the first operating voltage and the second clock signal drives a second circuit operating at the second operating voltage.

11. The system of claim 9 wherein the common clock signal is provided to the first clocking circuitry and the second clocking circuitry, wherein the first clocking circuitry is operable to generate the first clock signal based on the common clock signal, and wherein the second clocking circuitry is operable to generate the second clock signal based on the common clock signal.

12. The system of claim 11 wherein the delay adjuster delays the first clock signal by delaying the common clock signal prior to providing the common clock signal to the first clocking circuitry.

13. The system of claim 9 further comprising a level adjuster operable to modify a level of the common clock signal and to provide the modified clock signal to the second clocking circuitry, and wherein the second clocking circuitry is operable to generate the second clock signal based on the modified clock signal.

14. A method for compensating for phase differences between a plurality of clock signals associated with a plurality of signal levels, comprising the steps of:
   modifying a signal level of a clock signal to generate a first clock signal associated with a first signal level that is different than a second signal level associated with a second clock signal;
   comparing a phase of the first clock signal with a phase of the second clock signal to generate at least one compensation signal indicative of a phase difference between the first clock signal and the second clock signal; and
   delaying the first clock signal to compensate for the phase difference between the first clock signal and the second clock signal.

15. The method of claim 14 wherein:
   the comparing step further comprises the steps of:
      comparing a rising edge of the first clock signal with a rising edge of the second clock signal to generate a rising edge compensation signal indicative of a phase difference between the rising edge of the first clock signal and the rising edge of the second clock signal; and
      comparing a falling edge of the first clock signal with a falling edge of the second clock signal to generate a falling edge compensation signal indicative of a phase difference between the falling edge of the first clock signal and the falling edge of the second clock signal;
   and the delaying step further comprises the steps of:
      delaying the rising edge of the first clock signal in response to the rising edge compensation signal; and
      delaying the falling edge of the first clock signal in response to the falling edge compensation signal.

16. The method of claim 14 wherein the delaying step comprises selectively routing the first clock signal through at least one of a plurality of delay elements to compensate for the phase difference between the first clock signal and the second clock signal.

17. A method for compensating for phase differences between a plurality of clock signals associated with a plurality of signal levels, comprising the steps of:
   modifying a signal level of a clock signal to generate a first clock signal having a first signal level that is different than a second signal level of a second clock signal;
   comparing a phase of the first clock signal with a phase of the second clock signal to generate at least one compensation signal indicative of a phase difference between the first clock signal and the second clock signal; and delaying the first clock signal to compensate for the phase difference between the first clock signal and the second clock signal.

18. The method of claim 17 wherein:

the comparing step further comprises the steps of:
- comparing a rising edge of the first clock signal with a rising edge of the second clock signal to generate a rising edge compensation signal indicative of a phase difference between the rising edge of the first clock signal and the rising edge of the second clock signal; and
- comparing a falling edge of the first clock signal with a falling edge of the second clock signal to generate a falling edge compensation signal indicative of a phase difference between the falling edge of the first clock signal and the falling edge of the second clock signal;

and the delaying step further comprises the steps of:
- delaying the rising edge of the first clock signal in response to the rising edge compensation signal; and
- delaying the falling edge of the first clock signal in response to the falling edge compensation signal.

19. The method of claim 17 wherein the delaying step comprises selectively routing the first clock signal through at least one of a plurality of delay elements to compensate for the phase difference between the first clock signal and the second clock signal.

\* \* \* \* \*